(12) United States Patent  (10) Patent No.: US 9,048,843 B1
Nordyke  (45) Date of Patent: Jun. 2, 2015

(54) TECHNIQUES FOR DIVIDING FREQUENCIES OF PERIODIC SIGNALS

(71) Applicant: Altera Corporation, San Jose, CA (US)

(72) Inventor: Warren Trent Nordyke, Cupertino, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 14/255,373

(22) Filed: Apr. 17, 2014

(51) Int. Cl.
*H03K 21/00* (2006.01)
*H03K 21/02* (2006.01)

(52) U.S. Cl.
CPC ............ *H03K 21/023* (2013.01); *H03K 21/026* (2013.01)

(58) Field of Classification Search
USPC .................................................. 327/115, 117
See application file for complete search history.

(56) References Cited

U.S. PATENT DOCUMENTS 8,513,987 B1    8/2013  Kim et al.
8,559,587 B1 * 10/2013  Buell et al. ...................... 377/47

\* cited by examiner

*Primary Examiner* — Daniel Rojas
(74) *Attorney, Agent, or Firm* — Steven J. Cahill

(57) ABSTRACT

A frequency divider circuit includes an adder circuit, multiplexer circuits, and a phase interpolator circuit. The adder circuit generates a summed value. The multiplexer circuits receive first periodic signals and generate second periodic signals by selecting among the first periodic signals based on the summed value. The phase interpolator circuit generates a third periodic signal using a weighted average of the second periodic signals that is determined based on the summed value.

21 Claims, 14 Drawing Sheets

TECHNIQUES FOR DIVIDING FREQUENCIES OF PERIODIC SIGNALS

FIELD OF THE DISCLOSURE

The present disclosure relates to electronic circuits, and more particularly to circuits and methods for dividing frequencies of periodic signals.

BACKGROUND

A phase-locked loop (PLL) is an electronic circuit that adjusts the frequency of a feedback clock signal to match the frequency of an input reference clock signal. Phase-locked loops (PLLs) are in many integrated circuits, providing periodic clock signals for data recovery, data transfer, and other clocking functions. PLLs often supply a clock signal to one or more counters or dividers that divide a clock signal generated by an oscillator to a lower frequency clock signal for distribution around an integrated circuit or system.

BRIEF SUMMARY

According to some embodiments, a frequency divider circuit includes an adder circuit, multiplexer circuits, and a phase interpolator circuit. The adder circuit generates a summed value. The multiplexer circuits receive first periodic signals and generate second periodic signals by selecting among the first periodic signals based on the summed value. The phase interpolator circuit generates a third periodic signal using a weighted average of the second periodic signals that is determined based on the summed value.

According to further embodiments, a circuit includes an adder circuit, multiplexer circuits, a phase interpolator circuit, and a frequency divider circuit. The adder circuit generates a summed value based on a fractional number that is part of a frequency division value. The multiplexer circuits select among first periodic signals based on the summed value to generate second periodic signals. The phase interpolator circuit generates a third periodic signal using the second periodic signals based on the summed value. The frequency divider circuit generates a frequency divided signal using the third periodic signal based on an integer number that is part of the frequency division value. The circuit causes a frequency of the frequency divided signal to equal a frequency of one of the first periodic signals divided by the frequency division value.

Various objects, features, and advantages of the present invention will become apparent upon consideration of the following detailed description and the accompanying drawings.

DETAILED DESCRIPTION

Some types of integrated circuits use clock signals having several different relative phase offsets. A phase-locked loop (PLL) circuit is able to generate multiple clock signals having different phases. However, some integrated circuits, such as field programmable gate arrays (FPGAs), may require more clock signal phases than can be generated by a small number of PLLs. Providing enough PLLs on an integrated circuit to generate a large number of clock signal phases may require too much die area. In addition, PLLs may respond too slowly for some applications.

According to some embodiments described herein, a frequency divider circuit generates an output clock signal from input clock signals. A clock signal generation circuit, such as a phase-locked loop or a delay-locked loop, generates the input clock signals. Each of the input clock signals may have the same frequency. The frequency divider circuit causes the frequency of its output clock signal to equal the frequency of each of the input clock signals divided by a frequency division value. The frequency division value equals an integer number multiplied by a fractional number. The fractional number may be a non-integer rational number or an integer number. The frequency division value may equal any rational number. The frequency divider circuit may perform the functionality of a phase-locked loop (PLL), such as generating a frequency divided clock signal, while using less die area than a PLL. The frequency divider circuit can adjust the phase and/or frequency of its output clock signal in response to phase and/or frequency changes in its input clock signals faster than a PLL.

Figure 1:
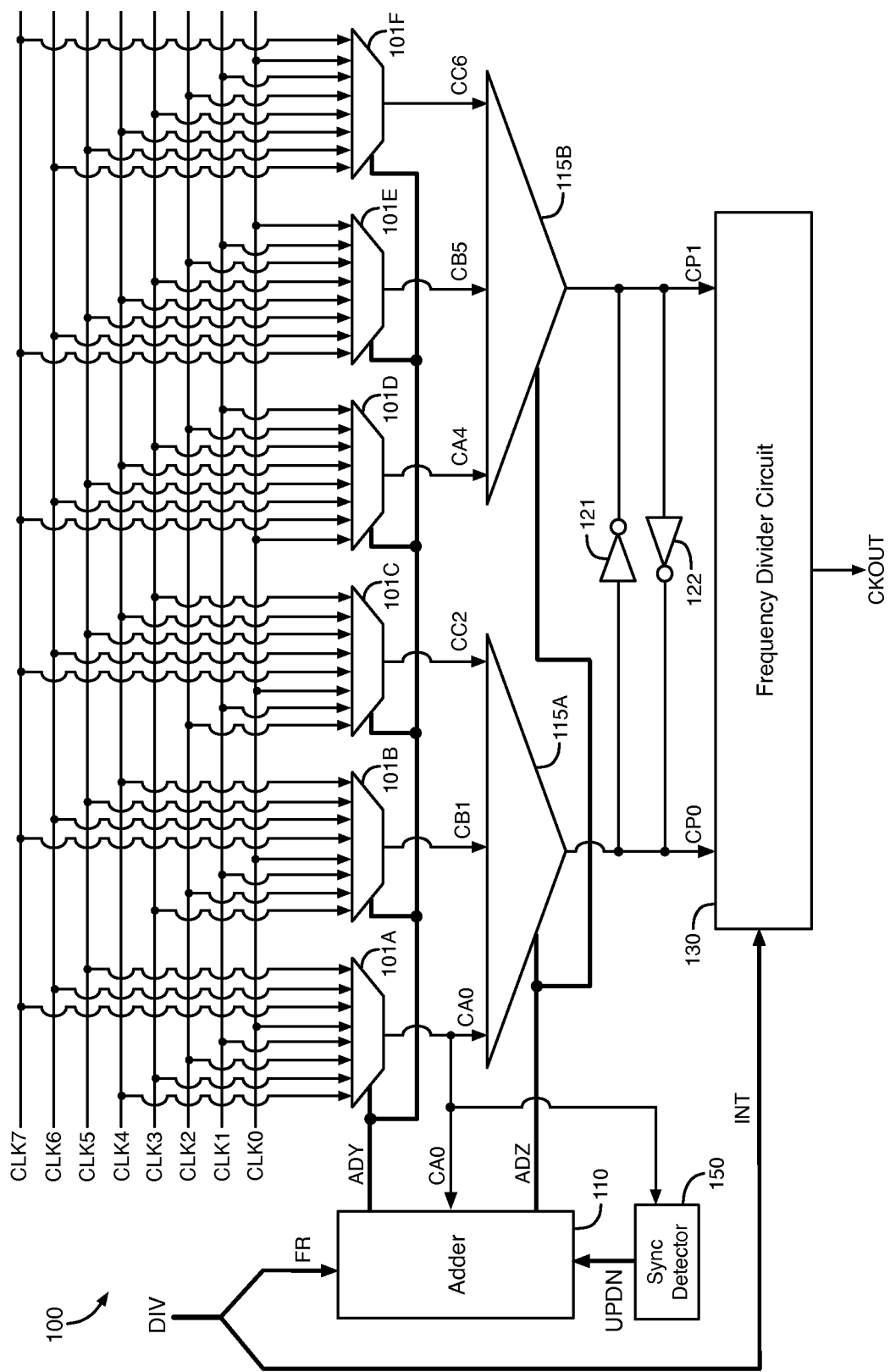
FIG. 1 illustrates an example of a frequency divider circuit, according to an embodiment of the present invention.

FIG. 1 illustrates an example of a frequency divider circuit 100, according to an embodiment of the present invention. Frequency divider circuit 100 includes six multiplexer circuits 101A-101F, an adder circuit 110, two phase interpolator circuits 115A-115B, two inverter circuits 121-122, a frequency divider circuit 130, and a synchronization (sync) detector circuit 150. Frequency divider circuit 100 may be in an integrated circuit. The integrated circuit may be, for example, an application specific integrated circuit or a programmable logic integrated circuit, such as a field programmable gate array (FPGA).

FIG. 1 illustrates eight clock signals CLK0, CLK1, CLK2, CLK3, CLK4, CLK5, CLK6, and CLK7 (i.e., CLK0-CLK7). Clock signals CLK0-CLK7 and other clock signals described herein are periodic signals. A periodic signal has a repeating period. Clock signals CLK0-CLK7 may have a 50% duty cycle or any other duty cycle. Clock signals CLK0-CLK7 may be, for example, generated by a phase-locked loop or delay-locked loop circuit. Each of clock signals CLK0-CLK7 has the same frequency. Clock signals CLK0, CLK1, CLK2, CLK3, CLK4, CLK5, CLK6, and CLK7 have relative phase offsets of 0°, 45°, 90°, 135°, 180°, 225°, 270°, and 315°, respectively. Thus, clock signals CLK0-CLK7 are offset in phase from each other at 45° (i.e., ⅛ clock period) intervals.

Each of the eight clock signals CLK0-CLK7 is provided to a multiplexing input of each of the six multiplexer circuits 101A-101F. Thus, each of multiplexer circuits 101A-101F receives all eight clock signals CLK0-CLK7 at its multiplexing inputs, as shown in FIG. 1. Clock signals CLK0-CLK7 are provided to the multiplexing inputs of each of the multiplexer circuits 101A-101F in a unique order with respect to the other multiplexer circuits 101A-101F, as described in detail below with respect to FIG. 4A.

Frequency divider circuit 100 generates a periodic output clock signal CKOUT based on the eight clock signals CLK0-CLK7. Frequency divider circuit 100 causes the frequency of output clock signal CKOUT to equal the frequency of each of clock signals CLK0-CLK7 divided by a frequency division value. In an embodiment, signals DIV indicate the frequency division value of circuit 100 in binary. The frequency division value of circuit 100 and signals DIV are adjustable. The frequency division value of circuit 100 and signals DIV can be programmed to equal any rational number. Signals DIV may, for example, be stored in a storage circuit (not shown).

In some embodiments, the frequency division value of circuit 100 as indicated by signals DIV equals an integer number multiplied by a fractional number. The fractional number may be an integer number or a non-integer rational number. If the fractional number is selected to be a non-integer rational number, then frequency divider circuit 100 functions as a fractional frequency divider circuit. The integer and fractional numbers are positive numbers. In some embodiments, the fractional number may be 1 or 2 or a non-integer rational number greater than 1 and less than 2.

Signals DIV include a first subset of signals FR and a second subset of signals INT. The binary value of signals FR indicates the fractional number that is part of the frequency division value of circuit 100. The binary value of signals INT indicates the integer number that is part of the frequency division value of circuit 100.

Signals FR are provided to inputs of adder circuit 110. Adder circuit 110 also receives a periodic clock signal CA0 from the output of multiplexer circuit 101A and control signals UPDN from sync detector circuit 150. Adder circuit 110 generates signals ADY and signals ADZ based on signals FR and UPDN in response to clock signal CA0. Adder circuit 110 generates a binary output. Signals ADY indicate the most significant bits (MSBs) of the binary output of adder circuit 110, and signals ADZ indicate the least significant bits (LSBs) of the binary output of adder circuit 110. Adder circuit 110 continuously increases (or continuously decreases) the value of its binary output based on the fractional number indicated by signals FR. Further details of exemplary embodiments of adder circuit 110 are described below with respect to FIGS. 2-3.

Signals ADY are provided to select inputs of each of the six multiplexer circuits 101A-101F. Multiplexer circuits 101A, 101B, 101C, 101D, 101E, and 101F generate periodic clock signals CA0, CB1, CC2, CA4, CB5, and CC6, respectively, based on clock signals CLK0-CLK7 and signals ADY. Further details of exemplary embodiments of multiplexer circuits 101A-101F are shown in and described below with respect to FIGS. 4A-4B. Clock signals CA0, CB1, CC2, CA4, CB5, and CC6 have relative phase offsets of 270°, 225°, 180°, 90°, 45°, and 0°, respectively.

Clock signals CA0, CB1, and CC2 are provided to inputs of phase interpolator circuit 115A. Phase interpolator circuit 115A generates a periodic clock signal CP0 at its output based on clock signals CA0, CB1, and CC2. Clock signals CA4, CB5, and CC6 are provided to inputs of phase interpolator circuit 115B. Phase interpolator circuit 115B generates a periodic clock signal CP1 at its output based on clock signals CA4, CB5, and CC6. Further details of an exemplary embodiment of each of phase interpolator circuits 115A-115B are shown in and described below with respect to FIG. 5A.

Clock signals CP0 and CP1 are complementary periodic signals that are 180 degrees out of phase with each other. Inverter circuit 121 inverts the logic state of clock signal CP0 to buffer clock signal CP1, and inverter circuit 122 inverts the logic state of clock signal CP1 to buffer clock signal CP0.

Frequency divider circuit 130 generates the output clock signal CKOUT of frequency divider circuit 100 based on complementary clock signals CP0 and CP1. Signals INT are provided to inputs of frequency divider circuit 130. Frequency divider circuit 130 is an integer frequency divider circuit. Frequency divider circuit 130 generates the frequency FOUT of output clock signal CKOUT by dividing the frequency FCP of each of clock signals CP0 and CP1 by the integer number indicated by the binary value of signals INT. Thus, the frequency FOUT of clock signal CKOUT equals FCP/INT.

Figure 2:
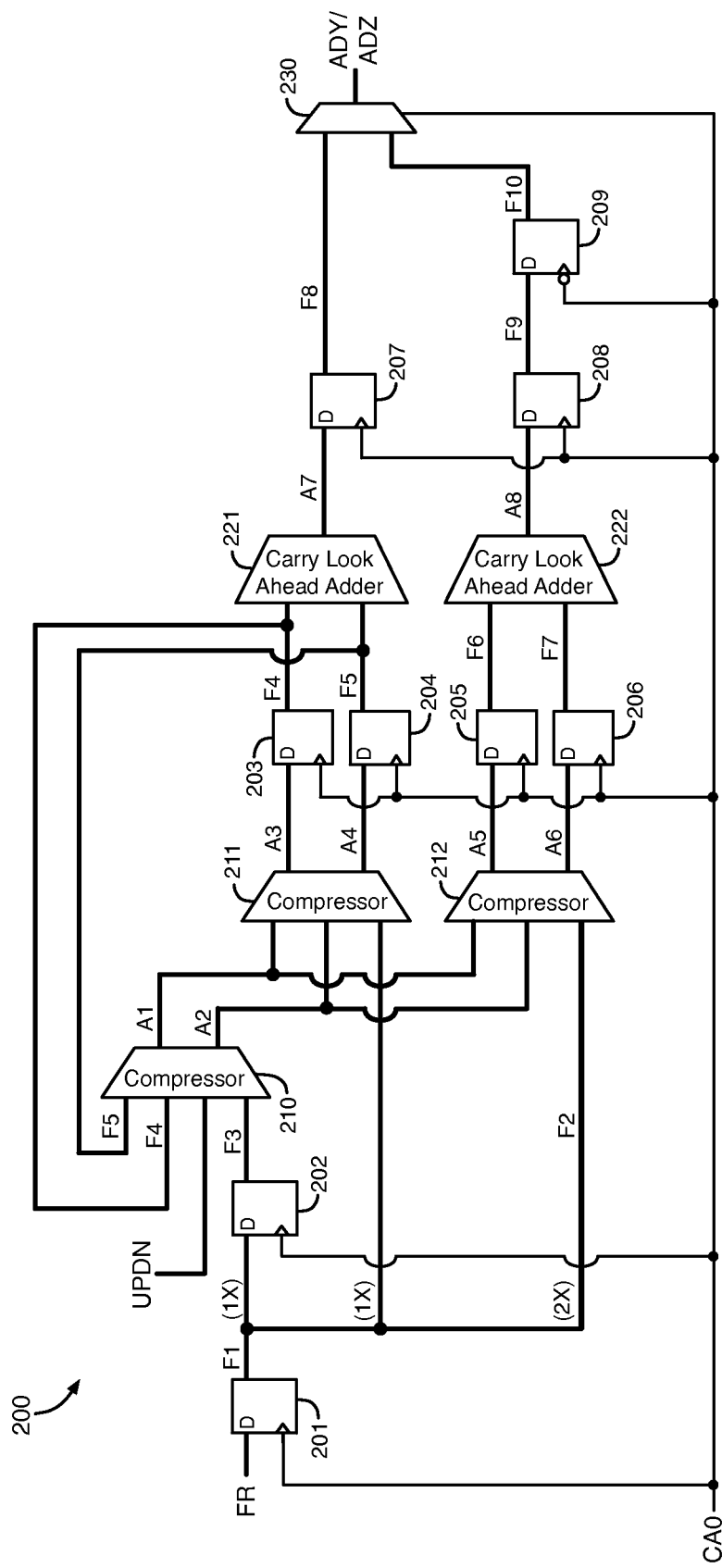
FIG. 2 illustrates an example of an adder circuit in the frequency divider circuit of FIG. 1, according to an embodiment of the present invention.

FIG. 2 illustrates an example of an adder circuit 200, according to an embodiment of the present invention. Adder circuit 200 shown in FIG. 2 is an example of adder circuit 110 shown in FIG. 1. Adder circuit 200 is a carry save accumulating adder circuit. Adder circuit 200 includes 9 groups of flip-flop circuits 201-209, compressor circuits 210-212, carry look ahead adder circuits 221-222, and multiplexer circuit 230.

Each of the compressor circuits 210-212 is a type of adder circuit that uses carry save addition. Each of the compressor circuits 210-212 adds three or four input numbers together to generate a first output indicating a sequence of partial sum bits and a second output indicating a sequence of carry bits. Each compressor circuit 210-212 computes a sequence of partial sum bits by adding together the three or four input numbers column-by-column without adding the carry bits from the previous columns. Each compressor circuit 210-212 outputs the carry bits from each column of the addition as a sequence of carry bits. Each of the compressor circuits 210-212 generates separate first and second outputs. Another adder circuit can combine the first and second outputs of a compressor circuit to generate a complete sum of the three or four input numbers to the compressor circuit.

In FIG. 2, each of the 9 boxes labeled 201-209 represents multiple flip-flop circuits operating in parallel with each other to store the values of parallel signals. Signals FR are provided in parallel to the D inputs of flip-flop circuits 201. Clock signal CA0 is provided to the clock input of each of the flip-flop circuits in each of the 9 groups of flip-flop circuits 201-209. Flip-flop circuits 201 store the values of signals FR at their Q outputs as parallel signals F1 in response to each rising edge of clock signal CA0. The binary value of signals F1 equals the binary value of signals FR. Signals F1 are provided in parallel to the D inputs of flip-flop circuits 202 and to a first set of inputs of compressor circuit 211.

Signals F1 are bit shifted using a wire bit shift to generate signals F2. The binary value of signals F2 equals two times (2X) the binary value of signals F1 (i.e., F2=2×F1). Signals F2 are provided to a first set of inputs of compressor circuit 212. The binary value of signals F1 as received at the D inputs of flip-flop circuits 202 and at the first set of inputs of compressor circuit 211 is not changed (1X) relative to the binary value of signals F1 as generated at the Q outputs of flip-flop circuits 201.

Flip-flop circuits 202 store the values of signals F1 at their Q outputs as parallel signals F3 in response to each rising edge of clock signal CA0. Signals F3 are provided in parallel to a first set of inputs of compressor circuit 210. Control signals UPDN are provided to a second set of inputs of compressor circuit 210. Signals F4 are provided to a third set of inputs of compressor circuit 210. Signals F5 are provided to a fourth set of inputs of compressor circuit 210.

Compressor circuit 210 is a 4-2 compressor circuit that adds together the four numbers indicated by the binary values of the four sets of signals F3, F4, F5, and UPDN to generate a sequence of partial sum bits and a sequence of carry bits. Compressor circuit 210 generates output signals A1 and output signals A2. Compressor circuit 210 causes signals A1 to indicate the sequence of partial sum bits generated by summing the four numbers indicated by signals F3, F4, F5, and UPDN using modulo 2 addition. Compressor circuit 210 causes signals A2 to indicate the sequence of carry bits generated by adding the four numbers indicated by signals F3, F4, F5, and UPDN.

Signals A2 are provided to a second set of inputs of compressor circuit 211. Signals A1 are provided to a third set of inputs of compressor circuit 211. Compressor circuit 211 is a 3-2 compressor circuit that adds together the three numbers indicated by the binary values of the three sets of signals A1, A2, and F1 to generate a sequence of partial sum bits and a sequence of carry bits. Compressor circuit 211 generates output signals A3 and output signals A4. Compressor circuit 211 causes signals A3 to indicate the sequence of partial sum bits generated by summing the three numbers indicated by signals A1, A2, and F1 using modulo 2 addition. Compressor circuit 211 causes signals A4 to indicate the sequence of carry bits generated by adding the three numbers indicated by signals A1, A2, and F1.

Signals A2 are provided to a second set of inputs of compressor circuit 212. Signals A1 are provided to a third set of inputs of compressor circuit 212. Compressor circuit 212 is a 3-2 compressor circuit that adds together the three numbers indicated by the binary values of the three sets of signals A1, A2, and F2 to generate a sequence of partial sum bits and a sequence of carry bits. Compressor circuit 212 generates output signals A5 and output signals A6. Compressor circuit 212 causes signals A5 to indicate the sequence of partial sum bits generated by summing the three numbers indicated by signals A1, A2, and F2 using modulo 2 addition. Compressor circuit 212 causes signals A6 to indicate the sequence of carry bits generated by adding the three numbers indicated by signals A1, A2, and F2.

Signals A3 are provided to the D inputs of flip-flop circuits 203. Flip-flop circuits 203 store the values of signals A3 at their Q outputs as parallel signals F4 in response to each rising edge of clock signal CA0. Signals A4 are provided to the D inputs of flip-flop circuits 204. Flip-flop circuits 204 store the values of signals A4 at their Q outputs as parallel signals F5 in response to each rising edge of clock signal CA0. Signals A5 are provided to the D inputs of flip-flop circuits 205. Flip-flop circuits 205 store the values of signals A5 at their Q outputs as parallel signals F6 in response to each rising edge of clock signal CA0. Signals A6 are provided to the D inputs of flip-flop circuits 206. Flip-flop circuits 206 store the values of signals A6 at their Q outputs as parallel signals F7 in response to each rising edge of clock signal CA0.

Signals F4 and F5 are provided to the third and fourth sets of inputs, respectively, of compressor circuit 210 as described above and shown in FIG. 2. Signals F4 and F5 are also provided to first and second sets of inputs, respectively, of carry look ahead adder circuit 221. Carry look ahead adder circuit 221 adds the binary value indicated by signals F4 to the binary value indicated by signals F5 to generate a sum indicated by the binary value of its output signals A7. Signals A7 are provided to the D inputs of flip-flop circuits 207. Flip-flop circuits 207 store the values of signals A7 at their Q outputs as parallel signals F8 in response to each rising edge of clock signal CA0. Signals F8 are provided to a first set of multiplexing inputs of multiplexer circuit 230.

Signals F6 and F7 are provided to first and second sets of inputs, respectively, of carry look ahead adder circuit 222. Carry look ahead adder circuit 222 adds the binary value indicated by signals F6 to the binary value indicated by signals F7 to generate a sum indicated by the binary value of its output signals A8. Signals A8 are provided to the D inputs of flip-flop circuits 208. Flip-flop circuits 208 store the values of signals A8 at their Q outputs as parallel signals F9 in response to each rising edge of clock signal CA0. Signals F9 are provided to the D inputs of flip-flop circuits 209. Flip-flop circuits 209 store the values of signals F9 at their Q outputs as parallel signals F10 in response to each falling edge of clock signal CA0. Signals F10 are provided to a second set of multiplexing inputs of multiplexer circuit 230.

Clock signal CA0 is provided to the select input of multiplexer circuit 230. Multiplexer circuit 230 generates a set of parallel output signals ADY/ADZ at its parallel outputs. Multiplexer circuit 230 causes the binary value of signals ADY/ADZ to equal the binary value of signals F8 or F10 based on the logic state of clock signal CA0. Signals ADY indicate the most significant bits of the binary value of signals ADY/ADZ, and signals ADZ indicate the least significant bits of the binary value of signals ADY/ADZ. As an example that is not intended to be limiting, signals ADY/ADZ may have 6 parallel signals indicating 6 bits, with signals ADY indicating the 3 most significant bits of the binary value of signals ADY/ADZ, and signals ADZ indicating the 3 least significant bits of the binary value of signals ADY/ADZ.

Sync detector circuit 150 can set the binary value of the UPDN control signals to zero or to a non-zero value. In each period of clock signal CA0 during the operation of adder circuit 200, compressor circuit 210 adds together the binary value of signals F3, the binary value of signals F4, the binary value of signals F5, and the binary value of signals UPDN to generate a sum indicated by signals A1 and A2. Also, in each period of clock signal CA0, compressor circuit 211 adds together the binary value of signals F1, the binary value of signals A1, and the binary value of signals A2 to generate a sum indicated by signals A3 and A4. Further, in each period of clock signal CA0, compressor circuit 212 adds together the binary value of signals F2 (i.e., two times the binary value of signals F1), the binary value of signals A1, and the binary value of signals A2 to generate a sum indicated by signals A5 and A6.

In each period of clock signal CA0 during the operation of adder circuit 200, carry look ahead adder circuit 221 adds the current binary value of signals F4 to the current binary value of signals F5 to generate a sum indicated by the binary value of signals A7. The binary values of signals F4 and F5 in the current period of clock signal CA0 equal the binary values of signals A3 and A4, respectively, that were generated by the end of the previous period of clock signal CA0. Also, in each period of clock signal CA0, carry look ahead adder circuit 222 adds the current binary value of signals F6 to the current binary value of signals F7 to generate a sum indicated by the binary value of signals A8. The binary values of signals F6 and F7 in the current period of clock signal CA0 equal the binary values of signals A5 and A6, respectively, that were generated by the end of the previous period of clock signal CA0. The binary values of signals F8 and F9 in the current period of clock signal CA0 equal the binary values of signals A7 and A8, respectively, that were generated by the end of the previous period of clock signal CA0. At each falling edge of clock signal CA0, the binary value of signals F10 is updated to equal the binary value of signals F9.

If the binary value of the UPDN signals equals zero, adder circuit 200 adds two times the binary value of signals FR to the binary value of signals F8 in response to each rising edge of clock signal CA0 (i.e., F8=F8+2FR). After four rising edges occur in clock signal CA0 subsequent to adder circuit 200 receiving a non-zero binary value in signals FR, the binary value of signals F9 equals the binary value of signals F8 plus the binary value of signals FR. Adder circuit 200 adds two times the binary value of signals FR to the binary value of signals F9 in response to each rising edge of clock signal CA0 if the binary value of the UPDN signals equals zero. Adder circuit 200 adds two times the binary value of signals FR to the binary value of signals F10 in response to each falling edge of clock signal CA0 (i.e., F10=F10+2FR) if the binary value of the UPDN signals equals zero. The UPDN signals may have a non-zero binary value, as described below with respect to FIG. 7.

Multiplexer circuit 230 switches between providing the binary value of signals F8 and the binary value of signals F10 to signals ADY/ADZ in each one-half period of clock signal CA0. As a result, adder circuit 200 causes the binary value of parallel signals ADY/ADZ to continuously increase by the binary value of signals FR in each one-half period of clock signal CA0. For example, if signals FR equal 100 in binary, the binary value of signals ADY/ADZ increase from 0 to 100 to 1000 to 1100 to 10000 to 10100 to 11000, etc. in consecutive one-half periods (i.e., half cycles) of clock signal CA0 during the operation of adder circuit 200.

In an embodiment, multiplexer circuit 230 causes the binary value of signals ADY/ADZ to equal the binary value of signals F8 when clock signal CA0 is in a logic low state. As a result, multiplexer circuit 101A causes each of the rising edges of clock signal CA0 to be generated based on the most significant bits of the binary value of signals F8 as indicated by signals ADY. In this embodiment, multiplexer circuit 230 causes the binary value of signals ADY/ADZ to equal the binary value of signals F10 when clock signal CA0 is in a logic high state. As a result, multiplexer circuit 101A causes each of the falling edges of clock signal CA0 to be generated based on the most significant bits of the binary value of signals F10 as indicated by signals ADY.

Each of the multiplexer circuits 101A, 101B, and 101C generates the rising edges of its respective output signal CA0, CB1, and CC2 based on the most significant bits of signals F8. Each of the multiplexer circuits 101A, 101B, and 101C generates the falling edges of its respective output signal CA0, CB1, and CC2 based on the most significant bits of signals F10. Clock signals CA0 and CA4 generated by multiplexer circuits 101A and 101D, respectively, are complementary clock signals. Clock signals CB1 and CB5 generated by multiplexer circuits 101B and 101E, respectively, are complementary clock signals. Clock signals CC2 and CC6 generated by multiplexer circuits 101C and 101F, respectively, are complementary clock signals. Each of the multiplexer circuits 101D, 101E, and 101F generates the falling edges of its respective output signal CA4, CB5, and CC6 based on the most significant bits of signals F8. Each of the multiplexer circuits 101D, 101E, and 101F generates the rising edges of its respective output signal CA4, CB5, and CC6 based on the most significant bits of signals F10.

Figure 3:
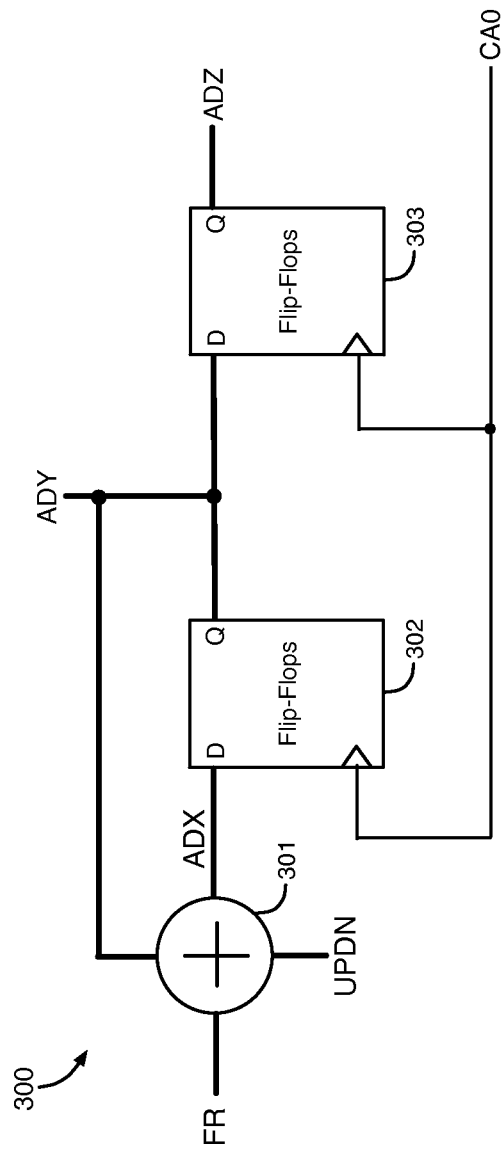
FIG. 3 illustrates another example of an adder circuit in the frequency divider circuit of FIG. 1, according to an alternative embodiment of the present invention.

FIG. 3 illustrates an example of an adder circuit 300, according to an alternative embodiment of the present invention. Adder circuit 300 shown in FIG. 3 is another example of adder circuit 110 shown in FIG. 1. Adder circuit 300 includes adder circuit 301, flip-flop circuits 302, and flip-flop circuits 303. Signals FR, UPDN, and ADY are provided to inputs of adder circuit 301. Adder circuit 301 adds together the binary value of signals FR, the binary value of signals ADY, and the binary value of signals UPDN to generate a sum that is indicated by the binary value of its output signals ADX.

Signals ADX are provided to the D inputs of flip-flop circuits 302. Clock signal CA0 is provided to the clock inputs of flip-flop circuits 302. Flip-flop circuits 302 are a group of double edge flip-flop circuits that update their outputs in response to each rising edge and each falling edge of the signal at their clock inputs. Flip-flop circuits 302 operate in parallel with each other to store the values of signals ADX at their Q outputs in signals ADY in response to each rising edge and each falling edge of clock signal CA0. Adder circuit 300 causes the binary value of signals ADY to increase by the binary value of signals FR in each subsequent one-half period of clock signal CA0.

Signals ADY are provided to the D inputs of flip-flop circuits 303. Clock signal CA0 is provided to the clock inputs of flip-flop circuits 303. Flip-flop circuits 303 are a group of double edge flip-flop circuits that update their outputs in response to each rising edge and each falling edge of the signal at their clock inputs. Flip-flop circuits 303 operate in parallel with each other to store the values of signals ADY at their Q outputs in signals ADZ in response to each rising edge and each falling edge of clock signal CA0. Adder circuit 300 causes the binary value of signals ADZ in the current one-half period of clock signal CA0 to equal the binary value of signals ADY in the previous one-half period of clock signal CA0.

Figure 4A:
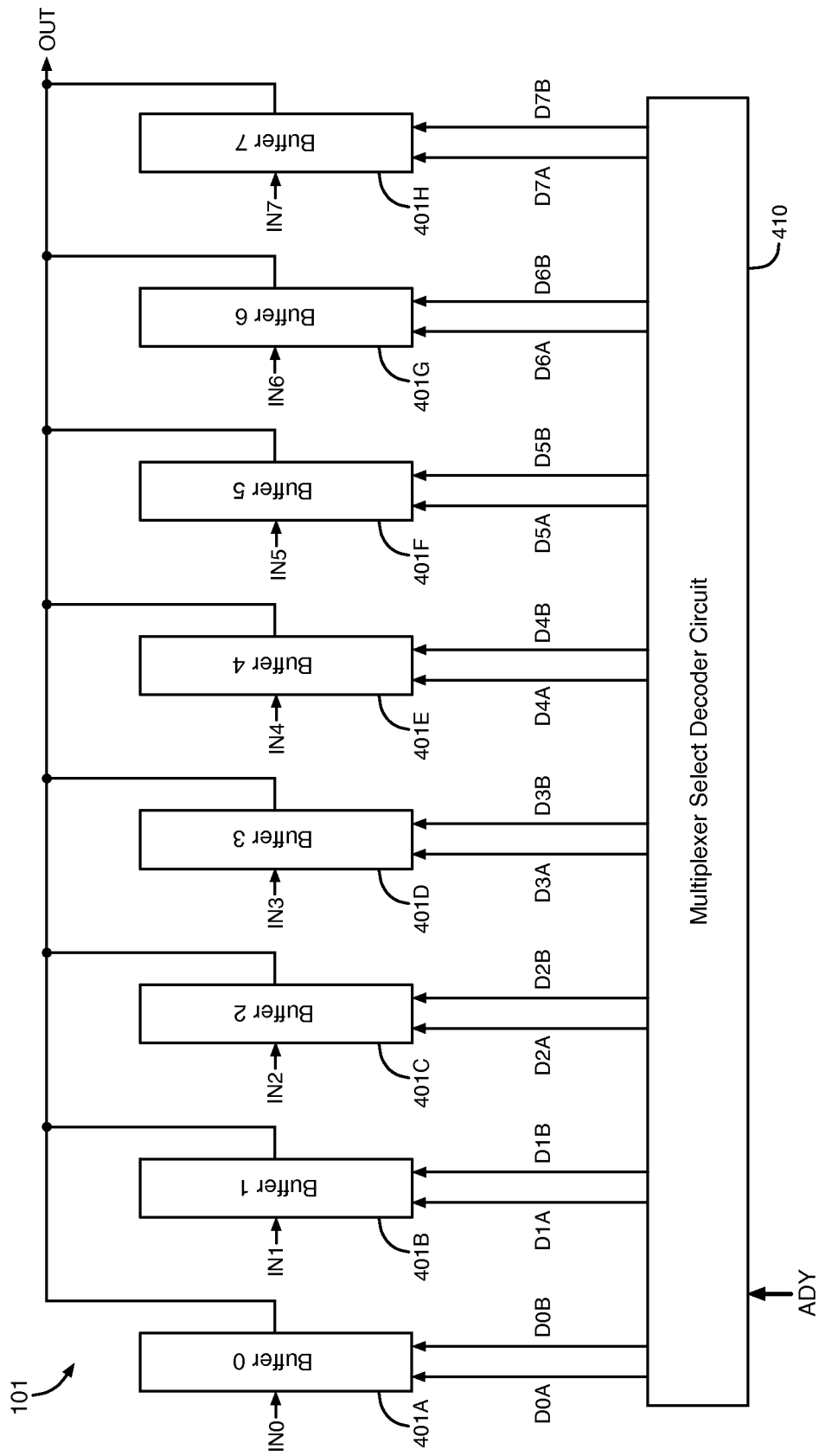
FIG. 4A illustrates an example of a multiplexer circuit in the frequency divider circuit of FIG. 1, according to an embodiment of the present invention.

FIG. 4A illustrates an example of a multiplexer circuit 101, according to an embodiment of the present invention. The circuitry of multiplexer circuit 101 shown in FIG. 4A is an example of the circuitry in each of the six multiplexer circuits 101A-101F shown in FIG. 1. In an embodiment, each of the six multiplexer circuits 101A-101F of FIG. 1 includes a separate set of the circuitry of multiplexer circuit 101 as shown in FIG. 4A.

Multiplexer circuit 101 includes eight buffer circuits 401A-401H and a multiplexer select decoder circuit 410. Signals ADY are provided to the inputs of multiplexer select decoder circuit 410. Multiplexer select decoder circuit 410 decodes signals ADY to generate 16 digital control signals D0A-D7A and D0B-D7B. Control signals D0A and D0B, D1A and D1B, D2A and D2B, D3A and D3B, D4A and D4B, D5A and D5B, D6A and D6B, and D7A and D7B are provided to inputs of buffer circuits 401A, 401B, 401C, 401D, 401E, 401F, 401G, and 401H, respectively, as shown in FIG. 4A. Control signals D0B-D7B have the inverse logic states of control signals D0A-D7A, respectively. Thus, control signals D0A-D7A and D0B-D7B, respectively, are 8 pairs of complementary signals.

Input signals IN0, IN1, IN2, IN3, IN4, IN5, IN6, and IN7 are provided to the inputs of buffer circuits 401A, 401B, 401C, 401D, 401E, 401F, 401G, and 401H, respectively, as shown in FIG. 4A. Each of the 8 input signals IN0-IN7 is one of the 8 clock signals CLK0-CLK7 that are shown in FIG. 1.

An exemplary embodiment is now described to provide examples of relationships between clock signals CLK0-CLK7 and input signals IN0-IN7 in each of multiplexer circuits 101A-101F. These examples are not intended to be limiting. In multiplexer circuit 101A, input signals IN0-IN7 are clock signals CLK4, CLK3, CLK2, CLK1, CLK0, CLK7, CLK6, and CLK5, respectively. In multiplexer circuit 101B, input signals IN0-IN7 are clock signals CLK3, CLK2, CLK1, CLK0, CLK7, CLK6, CLK5, and CLK4, respectively. In multiplexer circuit 101C, input signals IN0-IN7 are clock signals CLK2, CLK1, CLK0, CLK7, CLK6, CLK5, CLK4, and CLK3, respectively. In multiplexer circuit 101D, input signals IN0-IN7 are clock signals CLK0, CLK7, CLK6, CLK5, CLK4, CLK3, CLK2, and CLK1, respectively. In multiplexer circuit 101E, input signals IN0-IN7 are clock signals CLK7, CLK6, CLK5, CLK4, CLK3, CLK2, CLK1, and CLK0, respectively. In multiplexer circuit 101F, input signals IN0-IN7 are clock signals CLK6, CLK5, CLK4, CLK3, CLK2, CLK1, CLK0, and CLK7, respectively.

Each of the buffer circuits 401A-401H has an output that is coupled to the output of multiplexer circuit 101. Multiplexer circuit 101 generates an output signal OUT at its output. In multiplexer circuit 101A, the output signal OUT shown in FIG. 4A is clock signal CA0. In multiplexer circuit 101B, the output signal OUT shown in FIG. 4A is clock signal CB1. In multiplexer circuit 101C, the output signal OUT shown in FIG. 4A is clock signal CC2. In multiplexer circuit 101D, the output signal OUT shown in FIG. 4A is clock signal CA4. In multiplexer circuit 101E, the output signal OUT shown in FIG. 4A is clock signal CB5. In multiplexer circuit 101F, the output signal OUT shown in FIG. 4A is clock signal CC6. One or more of buffer circuits 401A-401H generates the output signal OUT of multiplexer circuit 101 based on its input signal IN0-IN7, respectively.

Control signals D0A-D7A and D0B-D7B control whether buffer circuits 401A-401H, respectively, are enabled or disabled. Multiplexer select decoder circuit 410 asserts only one complementary pair of the control signals D0A-D7A and D0B-D7B at a time. The complementary pair of the control signals D0A-D7A and D0B-D7B that is asserted enables a respective one of the buffer circuits 401A-401H. Multiplexer select decoder circuit 410 de-asserts the remaining 7 pairs of control signals D0A-D7A and D0B-D7B. Thus, only one of the buffer circuits 401A-401H is enabled at a time. The pairs of control signals D0A-D7A and D0B-D7B that are de-asserted disable the remaining seven buffer circuits 401A-401H.

Multiplexer select decoder circuit 410 asserts a different complementary pair of control signals D0A-D7A and D0B-D7B to enable a different one of buffer circuits 401A-401H in response to each change in the binary value of signals ADY. As an example that is not intended to be limiting, adder circuit 110 may increment the binary value of signals ADY from 000 to 001, then to 010, then to 011, then to 100, then to 101, then to 110, then to 111, then back to 000, repeating in this order. Multiplexer select decoder circuit 410 may, for example, assert control signals D7A/D7B, D6A/D6B, D5A/D5B, D4A/D4B, D3A/D3B, D2A/D2B, D1A/D1B, and D0A/D0B in response to binary values of 000, 001, 010, 011, 100, 101, 110, and 111 in signals ADY, respectively. This example is shown in and described with respect to FIG. 5B.

As another example, multiplexer select decoder circuit 410 may assert control signals D0A/D0B, D1A/D1B, D2A/D2B, D3A/D3B, D4A/D4B, D5A/D5B, D6A/D6B, and D7A/D7B in response to binary values of 000, 001, 010, 011, 100, 101, 110, and 111 in signals ADY, respectively. This example is shown in and described with respect to FIG. 4C.

Figure 4B:
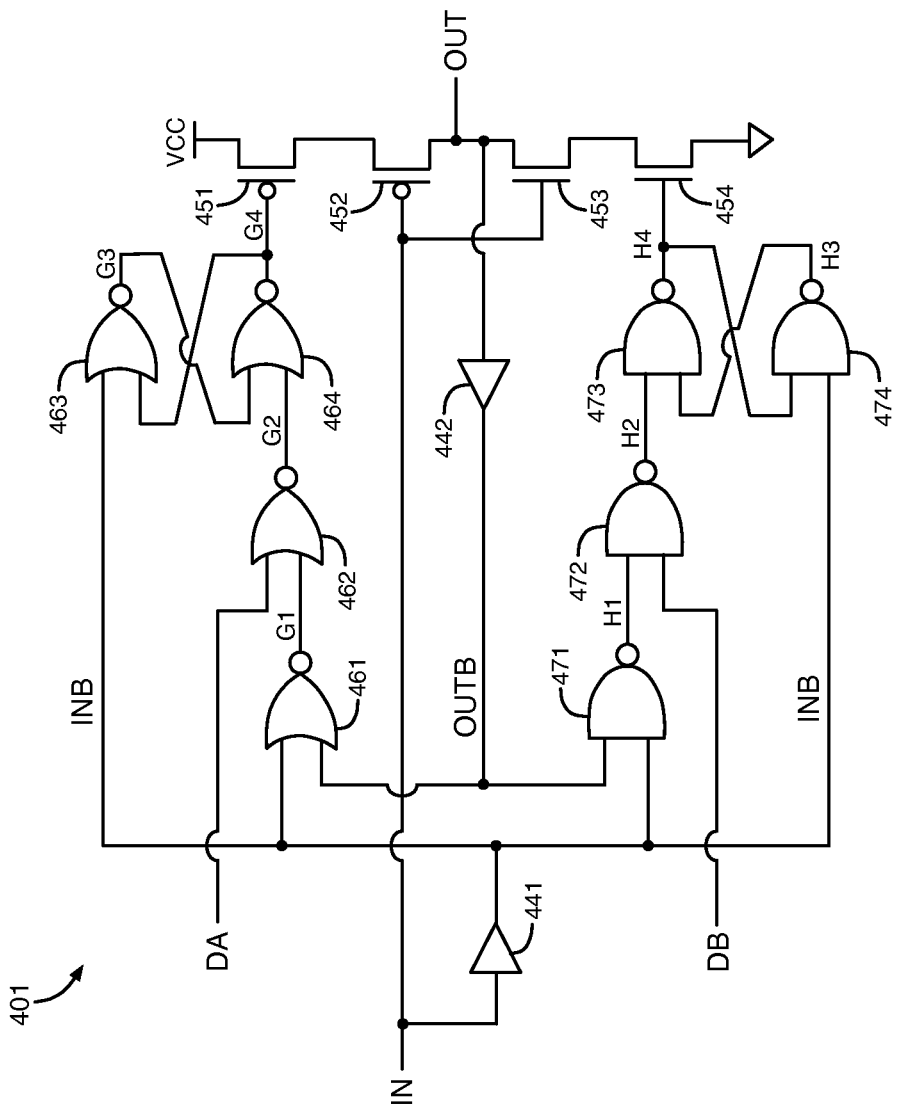
FIG. 4B illustrates an example of a buffer circuit in the multiplexer circuit of FIG. 4A, according to an embodiment of the present invention.

FIG. 4B illustrates an example of a buffer circuit 401, according to an embodiment of the present invention. Buffer circuit 401 in FIG. 4B is an example of each of the buffer circuits 401A-401H shown in FIG. 4A. In an embodiment, each of the buffer circuits 401A-401H in FIG. 4A includes a separate set of the circuitry of buffer circuit 401 as shown in FIG. 4B.

Buffer circuit 401 as shown in FIG. 4B receives input signal IN and control signals DA and DB as inputs and generates output signal OUT. Output signal OUT as shown in FIG. 4A is the same signal as output signal OUT shown in FIG. 4B. The output signal OUT is generated at an output node of buffer circuit 401. Input signal IN as shown in FIG. 4B corresponds to the input signal IN0-IN7 to the respective buffer circuit 401A-401H. Control signals DA and DB as shown in FIG. 4B correspond to control signals D0A/D0B, D1A/D1B, D2A/D2B, D3A/D3B, D4A/D4B, D5A/D5B, D6A/D6B, and D7A/D7B received by buffer circuits 401A-401H, respectively, shown in FIG. 4A.

Buffer circuit 401 in FIG. 4B includes non-inverting buffer circuits 441-442, p-channel transistors 451-452, n-channel transistors 453-454, NOR logic gate circuits 461-464, and NAND logic gate circuits 471-474. NOR logic gate circuits 463-464 are cross-coupled to form a NOR latch. NAND logic gate circuits 473-474 are cross-coupled to form a NAND latch. Transistors 451-454 are MOSFETs.

Input signal IN is provided to the gates of transistors 452-453. Buffer circuit 441 buffers input signal IN to generate buffered input signal INB. Buffered input signal INB is provided to the first input of each of NOR gate 461, NOR gate 463, NAND gate 471, and NAND gate 474. Control signals DA and DB are provided to first inputs of NOR gate 462 and NAND gate 472, respectively. Buffer circuit 442 buffers output signal OUT to generate buffered output signal OUTB. Buffered output signal OUTB is provided to the second input of each of NOR gate 461 and NAND gate 471.

Control signals DA and DB enable or disable buffer circuit 401. Buffer circuit 401 is disabled in response to control signal DA being de-asserted to a logic high state and control signal DB being de-asserted to a logic low state. Buffer circuit 401 does not generate a logic state transition in output signal OUT only in response to control signals DA and DB being de-asserted. Instead, buffer circuit 401 generates a logic state transition in output signal OUT in response to the next logic state transition in input signal IN that occurs after control signals DA and DB are de-asserted to disable buffer circuit 401. After the next logic state transition in input signal IN, buffer circuit 401 then prevents additional logic state transitions in input signal IN from propagating to output signal OUT while control signals DA and DB are de-asserted, until control signals DA and DB are asserted again to enable buffer circuit 401. Because buffer circuit 401 does not generate a logic state transition in output signal OUT only in response to control signals DA and DB being de-asserted, buffer circuit 401 prevents glitches in output signal OUT when one of buffer circuits 401A-401H goes from being enabled to being disabled, and another one of buffer circuits 401A-401H goes from being disabled to being enabled.

When signal IN is in a logic low state, transistor 452 is on and transistor 453 is off. Buffer circuit 441 generates a logic low state in signal INB based on the logic low state in signal IN. Control signals DA and DB are set to logic high and low states, respectively, to disable buffer circuit 401. The lower half of buffer circuit 401 is now described with respect to buffer circuit 401 being disabled. In response to control signal DB being in a logic low state, NAND gate 472 causes its output signal H2 to be in a logic high state. The logic low state in signal INB causes the output signal H3 of NAND gate 474 to be in a logic high state. NAND gate 473 causes signal H4 to be in a logic low state in response to the logic high states in signals H2-H3. Transistor 454 is off in response to signal H4 being in a logic low state, blocking current flow from the output node at output signal OUT to ground.

In response to a rising edge (i.e., a logic low-to-high transition) in signal IN, transistor 453 turns on, and transistor 452 turns off. Buffer circuit 441 generates a rising edge in signal INB in response to receiving a rising edge in signal IN. If control signal DB is still in a logic low state, then NAND gate 472 and the NAND latch cause signal H4 to remain in a logic low state after the rising edge in signal INB. Thus, transistor 454 remains off after the rising edge in signal INB if signal DB is a logic low, continuing to block current flow from the output node at output signal OUT to ground.

In response to a falling edge (i.e., a logic high-to-low transition) in signal IN, transistor 452 turns on, and transistor 453 turns off. Buffer circuit 441 generates a falling edge in signal INB in response to receiving a falling edge in signal IN. If control signal DB is still in a logic low state, then NAND gate 472 causes signal H2 to remain in a logic high state, which causes the NAND latch to keep signal H4 in a logic low state after the falling edge in signal INB, maintaining transistor 454 off. Thus, transistor 454 remains off blocking current from OUT to ground as long as signal DB is in a logic low state.

The upper half of buffer circuit 401 is now described with respect to buffer circuit 401 being disabled. When control signal DA is in a logic high state, NOR gate 462 causes its output signal G2 to be in a logic low state. In response to receiving a rising edge in signal INB, NOR gate 463 causes its output signal G3 to be in a logic low state. In response to both of its input signals G2 and G3 being in logic low states, NOR gate 464 causes its output signal G4 to be in a logic high state. Transistor 451 is off in response to signal G4 being in a logic high state, blocking current from supply voltage VCC to the output node at output signal OUT, regardless of the conductive state of transistor 452. If control signal DA remains in a logic high state, signal G4 remains in a logic high state, and NOR gate 463 maintains its output signal G3 in a logic low state even after a falling edge in signal INB. Transistor 451 remains off blocking current from supply voltage VCC to the output node at output signal OUT as long as control signal DA is in a logic high state. Thus, buffer circuit 401 prevents logic state transitions in signal IN from propagating to output signal OUT while transistors 451 and 454 are off.

Buffer circuit 442 causes signal OUTB to have the same logic state as signal OUT. Thus, buffer circuit 442 generates a rising edge in signal OUTB in response to a rising edge in signal OUT, and buffer circuit 442 generates a falling edge in signal OUTB in response to a falling edge in signal OUT. Buffer circuit 441 causes signal INB to have the same logic state as signal IN, as discussed above.

Buffer circuit 401 is enabled in response to control signal DA being in a logic low state and control signal DB being in a logic high state. When buffer circuit 401 is enabled, buffer circuit 401 generates a rising edge in output signal OUT in response to a falling edge in input signal IN, and buffer circuit 401 generates a falling edge in output signal OUT in response to a rising edge in input signal IN, as described below.

The upper half of buffer circuit 401 is now described with respect to buffer circuit 401 initially being enabled. In response to a logic high state in signal INB, NOR gate 461 generates a logic low state in its output signal G1, and NOR gate 463 generates a logic low state in its output signal G3. In response to signals G1 and DA both being in logic low states, NOR gate 462 causes its output signal G2 to be in a logic high state. In response to signal G2 being in a logic high state, NOR gate 464 causes its output signal G4 to be in a logic low state, regardless of the state of signal G3. Transistor 451 is on in response to signal G4 being in a logic low state.

In response to the next falling edge in signal INB, NOR gate 463 generates a rising edge in signal G3. The logic high state in signal G3 causes signal G4 to remain in a logic low state, which causes transistor 451 to remain on. After subsequent rising and falling edges in signals INB and OUTB that occur while control signal DA is in a logic low state, signal G4 remains low causing transistor 451 to remain on. If control signal DA is in a logic low state when signal IN has turned on transistor 452, transistors 451-452 provide current from supply voltage VCC to output signal OUT at the output node.

If signals G4 and INB are both in logic low states, the output signal G3 of NOR gate 463 is in a logic high state. If signal DA is de-asserted to a logic high state to disable buffer circuit 401 while signals G4 and INB are low, NOR gate 464 causes its output signal G4 to remain in a logic low state in response to the logic high state in signal G3, causing transistor 451 to remain on until the next rising edge in signal INB. In response to the next rising edge in signal INB, NOR gates 463 and 464 generate a rising edge in signal G4, causing transistor 451 to turn off. Thus, if signals IN and INB are in logic low states at a rising edge in signal DA, buffer circuit 401 causes transistors 451-452 to remain on until the next rising edges in signals IN and INB to prevent glitches in output signal OUT. Buffer circuit 401 as shown in FIG. 4B prevents glitches in output signal OUT that would occur when one of buffer circuits 401A-401H is disabled and another one of buffer circuits 401A-401H is enabled.

The lower half of buffer circuit 401 is now described with respect to buffer circuit 401 initially being enabled. In response to a logic low state in signal INB, NAND gate 471 generates a logic high state in its output signal H1. In response to signals H1 and DB both being in logic high states, NAND gate 472 causes its output signal H2 to be in a logic low state. In response to signal H2 being in a logic low state, NAND gate 473 causes its output signal H4 to be in a logic high state, regardless of the states of signals H3 and INB. Transistor 454 is on in response to signal H4 being in a logic high state.

In response to the next rising edge in signal INB, NAND gate 474 generates a falling edge in signal H3, causing signal H4 to remain in a logic high state, which causes transistor 454 to remain on. After subsequent rising and falling edges in signals INB and OUTB that occur while control signal DB is in a logic high state, signal H4 remains high, which causes transistor 454 to remain on. If control signal DB is in a logic high state when signal IN has turned on transistor 453, transistors 453-454 are both on providing current from output signal OUT at the output node to ground.

If signals H4 and INB are both in logic high states, the output signal H3 of NAND gate 474 is in a logic low state. If signal DB is de-asserted to a logic low state to disable buffer circuit 401 while signals H4 and INB are high, NAND gate 473 causes its output signal H4 to remain in a logic high state in response to the logic low state in signal H3, causing transistor 454 to remain on until the next falling edge in signal INB. In response to the next falling edge in signal INB, NAND gates 474 and 473 generate a falling edge in signal H4, causing transistor 454 to turn off. Thus, if signals IN and INB are in logic high states at a falling edge in signal DB, buffer circuit 401 causes transistors 453-454 to remain on until the next falling edges in signals IN and INB to prevent glitches in output signal OUT. As a result, buffer circuit 401 prevents glitches in output signal OUT that would occur when one of buffer circuits 401A-401H is disabled and another one of buffer circuits 401A-401H is enabled.

Figure 4C:
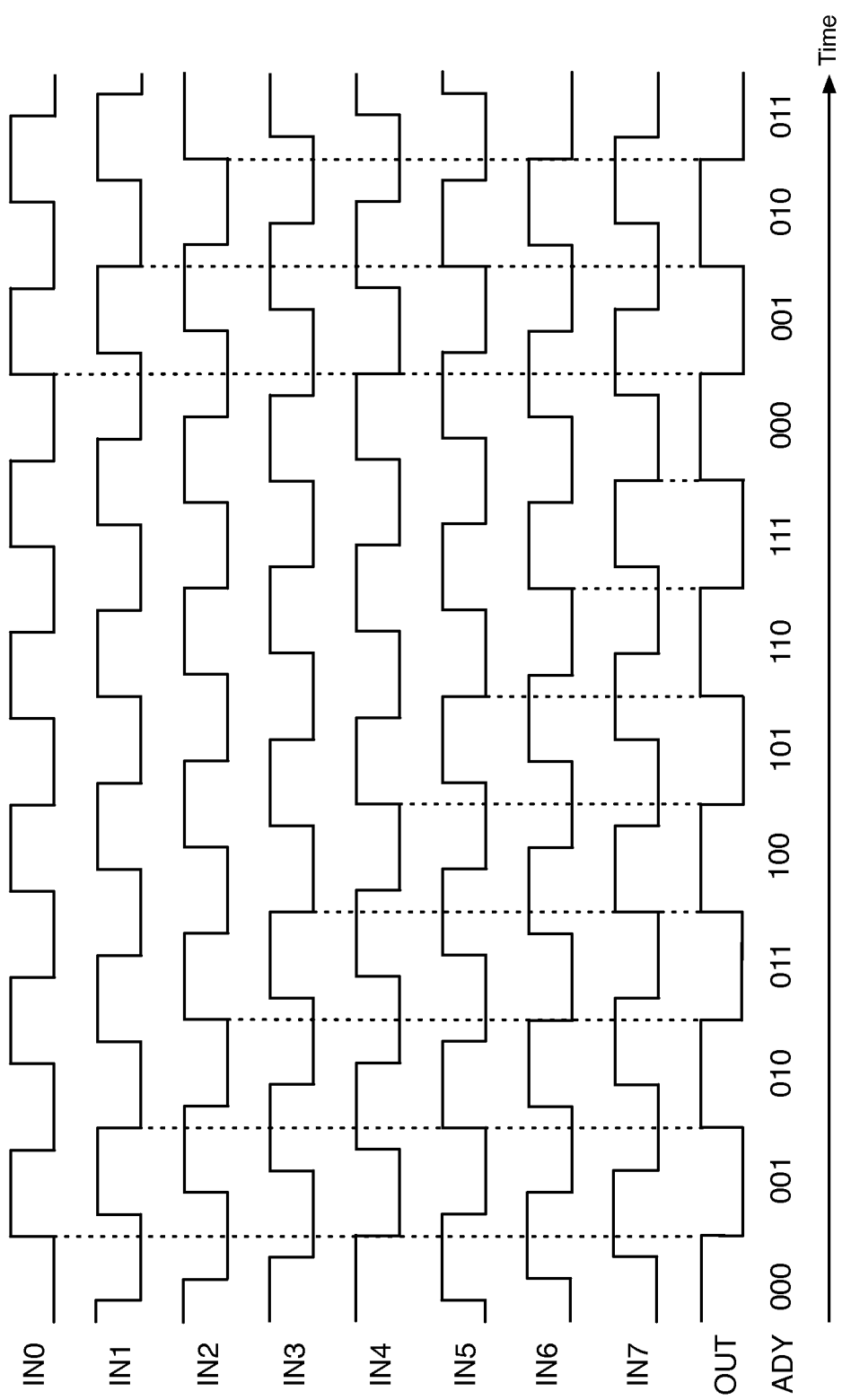
FIG. 4C is a timing diagram that illustrates examples of waveforms for the input signals and the output signal of the multiplexer circuit of FIG. 4A, according to an embodiment of the present invention.

FIG. 4C is a timing diagram that illustrates examples of waveforms for the input signals and the output signal of multiplexer circuit 101 of FIG. 4A, according to an embodiment of the present invention. FIG. 4C illustrates examples of waveforms for the input signals IN0-IN7 to multiplexer circuit 101 and the output signal OUT of multiplexer circuit 101 that are shown in FIG. 4A.

In the example of FIG. 4C, each of the input signals IN0-IN7 is a digital clock signal with a 50% duty cycle. Also, in the example of FIG. 4C, signals ADY have three signals, and adder circuit 110 increments the binary value of signals ADY from 000 to 001, then to 010, then to 011, then to 100, then to 101, then to 110, then to 111, then back to 000, repeating in this sequential order. In this example, multiplexer circuit 101 generates output signal OUT by buffering input signals IN0, IN1, IN2, IN3, IN4, IN5, IN6, and IN7 in response to signals ADY having binary values of 000, 001, 010, 011, 100, 101, 110, and 111, respectively.

Each of the buffer circuits 401A-401H inverts its respective input signal IN0-IN7 to generate output signal OUT when the respective buffer circuit is enabled, using for example transistors 451-454 in FIG. 4B. The vertical dotted lines in FIG. 4C indicate which of the input signals IN0-IN7 multiplexer 101 uses to generate output signal OUT for each rising and falling edge of output signal OUT. Multiplexer circuit 101 generates the first, second, third, and fourth falling edges of output signal OUT shown in FIG. 4C based on rising edges in input signals IN0, IN2, IN4, and IN6 using buffer circuits 401A, 401C, 401E, and 401G, respectively. Multiplexer circuit 101 generates the first, second, third, and fourth rising edges of output signal OUT shown in FIG. 4C based on falling edges in input signals IN1, IN3, IN5, and IN7 using buffer circuits 401B, 401D, 401F, and 401H, respectively.

FIG. 4C also shows the binary value of signals ADY in each one-half period of signal OUT. In the example of FIG. 4C, output signal OUT is clock signal CA0 in FIGS. 1-2. Adder circuit 110 changes the binary value of signals ADY/ADZ in response to each rising and falling edge of signal OUT/CA0 using multiplexer circuit 230, as discussed above with respect to FIG. 2. In the example of FIG. 4C, signals ADY have 3 signals that represent the 3 most significant bits of signals ADY/ADZ, signals ADZ have 3 signals that represent the 3 least significant bits of signals ADY/ADZ, and adder circuit 110 increases the binary value of signals ADY/ADZ by 8 in each one-half period of clock signal CA0. Using these exemplary values, each time that the binary value of signals ADY equals 0, adder circuit 110 increments the binary value of signals ADY by 1 in each subsequent one-half period of output signal OUT. After the binary value of signals ADY changes to 111 (i.e., 7 in decimal), adder circuit 110 causes the binary value of signals ADY to equal 0 in the next one-half period of output signal OUT, as shown in FIG. 4C, and then this process repeats.

Multiplexer circuit 101 uses a different one of the input signals IN0-IN7 to generate output signal OUT in response to each unique binary value of signals ADY. In the example of FIG. 4C, multiplexer circuit 101 uses a different one of input signals IN0-IN7 to generate each of the 8 logic state transitions (i.e., rising and falling edges) in output signal OUT within each set of 4 periods of output signal OUT. In the example of FIG. 4C, multiplexer circuit 101 continues to cycle through the 8 input signals IN0-IN7 iteratively, generating output signal OUT based on the next one of the input signals IN0-IN7 in response to each change in the binary value of signals ADY.

In the example of FIG. 4C, multiplexer circuit 101 causes the period of output signal OUT to be 1.25 times the period of each of input signals IN0-IN7. In other embodiments, multiplexer circuit 101 may cause the period of output signal OUT to have other relationship to the periods of input signals IN0-IN7. In further embodiments, multiplexer circuit 101 may use less than all of input signals IN0-IN7 to generate output signal OUT if adder circuit 110 causes signals ADY to cycle through less than 8 unique binary values.

Figure 5A:
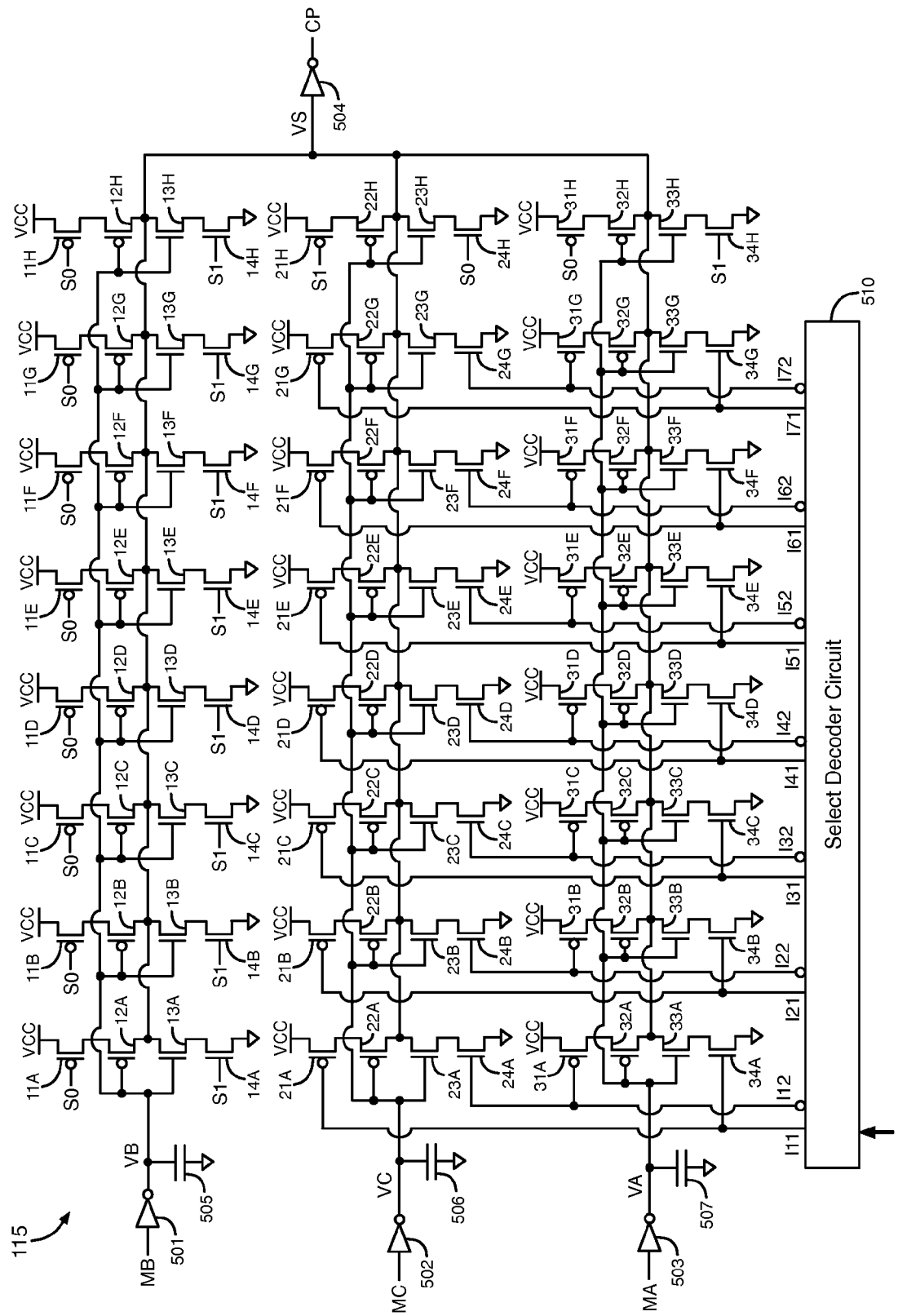
FIG. 5A illustrates an example of a phase interpolator circuit in the frequency divider circuit of FIG. 1, according to an embodiment of the present invention.

FIG. 5A illustrates an example of a phase interpolator circuit 115, according to an embodiment of the present invention. The circuitry of phase interpolator circuit 115 shown in FIG. 5A is an example of the circuitry in each of the phase interpolator circuits 115A-115B shown in FIG. 1. In an embodiment, each of the phase interpolator circuits 115A-115B of FIG. 1 includes a separate set of the circuitry of phase interpolator circuit 115 shown in FIG. 5A.

Phase interpolator circuit 115 in the example of FIG. 5A includes inverter circuits 501-504, capacitors 505-507, and select decoder circuit 510. Phase interpolator circuit 115 also includes p-channel transistors 11A-11H, 12A-12H, 21A-21H, 22A-22H, 31A-31H, and 32A-32H. Phase interpolator circuit 115 also includes n-channel transistors 13A-13H, 14A-14H, 23A-23H, 24A-24H, 33A-33H, and 34A-34H. Transistors 11A-11H, 12A-12H, 13A-13H, 14A-14H, 21A-21H, 22A-22H, 23A-23H, 24A-24H, 31A-31H, 32A-32H, 33A-33H, and 34A-34H may be, for example, metal oxide semiconductor field-effect transistors (MOSFETs). In an exemplary embodiment, each of these transistors may have the same width-to-length channel ratio.

Phase interpolator circuit 115 includes three portions referred to herein as stage A, stage B, and stage C. Stage A includes inverter circuit 503, capacitor 507, and transistors 31A-31H, 32A-32H, 33A-33H, and 34A-34H. Stage B includes inverter circuit 501, capacitor 505, and transistors 11A-11H, 12A-12H, 13A-13H, and 14A-14H. Stage C includes inverter circuit 502, capacitor 506, and transistors 21A-21H, 22A-22H, 23A-23H, and 24A-24H.

Input signals MA, MB, and MC are provided to stages A, B, and C at the inputs of inverter circuits 503, 501, and 502, respectively, as shown in FIG. 5A. In phase interpolator 115A shown in FIG. 1, input signals MA, MB, and MC are signals CA0, CB1, and CC2, respectively. In phase interpolator circuit 115B shown in FIG. 1, input signals MA, MB, and MC are signals CA4, CB5, and CC6, respectively.

Each of the input signals CA0, CB1, CC2, CA4, CB5, and CC6, and thus each of signals MA, MB, and MC, is a digital clock signal. However, multiplexer circuits 101A-101F may generate duty cycle distortion in clock signals CA0, CB1, CC2, CA4, CB5, and CC6, respectively. Duty cycle distortion causes the duty cycles of clock signals CA0, CB1, CC2, CA4, CB5, and CC6 to vary from 50%. Phase interpolator circuits 115A-115B reduce duty cycle distortion in clock signals CP0-CP1 relative to clock signals CA0, CB1, CC2, CA4, CB5, and CC6.

Inverter circuits 503, 501, and 502 invert input signals MA, MB, and MC to generate voltage signals VA, VB, and VC, respectively. Signals MA, MB, and MC have fast rising and falling edges. Capacitors 507, 505, and 506 cause the voltage waveforms of signals VA, VB, and VC to rise and fall more slowly than simply inverted voltage waveforms of signals MA, MB, and MC, respectively. The rise and fall times of voltage signals VA, VB, and VC are based on the RC (resistor-capacitor) time constants at their respective nodes. Capacitors 507, 505, and 506 cause signals VA, VB, and VC, respectively, to be analog voltage signals.

In stage B, the output of inverter 501 is coupled to the gates of transistors 12A-12H and 13A-13H. Signal VB is provided to the gates of transistors 12A-12H and 13A-13H. The drains of transistors 12A-12H and 13A-13H are coupled to the input of inverter circuit 504. The sources of transistors 11A-11H are coupled to a supply rail at supply voltage VCC, and the sources of transistors 14A-14H are coupled to a ground rail at the ground voltage.

A signal S0 is provided to the gates of transistors 11A-11H. A signal S1 is provided to the gates of transistors 14A-14H. During the operation of phase interpolator circuit 115, signal S0 remains in a logic low state, and signal S1 remains in a logic high state. For example, signal S0 may be at the ground voltage, and signal S1 may be at supply voltage VCC. As a result, signal S0 causes transistors 11A-11H to remain on during operation, and signal S1 causes transistors 14A-14H to remain on during operation.

Stage B includes 8 inverting buffers 1A-1H that are coupled in parallel. Each of the 8 inverting buffers 1A-1H includes 4 transistors coupled in series. Transistors 11A-14A, 11B-14B, 11C-14C, 11D-14D, 11E-14E, 11F-14F, 11G-14G, and 11H-14H form the 8 inverting buffers 1A, 1B, 1C, 1D, 1E, 1F, 1G, and 1H, respectively, in stage B. All of the 8 inverting buffers 1A-1H in stage B remain on during the operation of phase interpolator circuit 115, because transistors 11A-11H and 14A-14H remain on during the operation of phase interpolator circuit 115. The 8 inverting buffers 1A-1H in stage B buffer signal VB to generate signal VS at the input of inverter circuit 504.

Inverter circuit 504 inverts and buffers signal VS to generate signal CP at its output. Signal CP is a digital periodic clock signal. In phase interpolator circuit 115A, signal CP in FIG. 5A is signal CP0 in FIG. 1. In phase interpolator circuit 115B, signal CP in FIG. 5A is signal CP1 in FIG. 1.

In stage A, the output of inverter 503 is coupled to the gates of transistors 32A-32H and 33A-33H. Signal VA is provided to the gates of transistors 32A-32H and 33A-33H. The drains of transistors 32A-32H and 33A-33H are coupled to the input of inverter circuit 504. The sources of transistors 31A-31H are coupled to the supply rail at supply voltage VCC, and the sources of transistors 34A-34H are coupled to the ground rail at the ground voltage.

Stage A includes 8 inverting buffers 3A-3H that are coupled in parallel. Each of the 8 inverting buffers 3A-3H of stage A includes 4 transistors coupled in series. Transistors 31A-34A, 31B-34B, 31C-34C, 31D-34D, 31E-34E, 31F-34F, 31G-34G, and 31H-34H form the 8 inverting buffers 3A, 3B, 3C, 3D, 3E, 3F, 3G, and 3H, respectively, in stage A.

In stage C, the output of inverter 502 is coupled to the gates of transistors 22A-22H and 23A-23H. Signal VC is provided to the gates of transistors 22A-22H and 23A-23H. The drains of transistors 22A-22H and 23A-23H are coupled to the input of inverter circuit 504. The sources of transistors 21A-21H are coupled to the supply rail at supply voltage VCC, and the sources of transistors 24A-24H are coupled to the ground rail at the ground voltage.

Stage C includes 8 inverting buffers 2A-2H that are coupled in parallel. Each of the 8 inverting buffers 2A-2H of stage C includes 4 transistors coupled in series. Transistors 21A-24A, 21B-24B, 21C-24C, 21D-24D, 21E-24E, 21F-24F, 21G-24G, and 21H-24H form the 8 inverting buffers 2A, 2B, 2C, 2D, 2E, 2F, 2G, and 2H, respectively, in stage C.

Signal S0 is provided to the gates of transistors 24H and 31H. Signal S1 is provided to the gates of transistors 21H and 34H. Signals S0-S1 cause transistors 31H and 34H to remain on during the operation of phase interpolator 115. Signals S0-S1 cause transistors 21H and 24H to remain off during the operation of phase interpolator 115. Thus, the inverting buffer 2H formed by transistors 21H-24H in stage C is always off, and the inverting buffer 3H formed by transistors 31H-34H in stage A is always on during the operation of phase interpolator 115. Phase interpolator 115 causes the remaining 7 inverting buffers 3A-3G in stage A and the remaining 7 inverting buffers 2A-2G in stage C to be selectively turned on and off based on the binary value of signals ADZ.

Select decoder circuit 510 generates 14 digital control signals I11, I12, I21, I22, I31, I32, I41, I42, I51, I52, I61, I62, I71, and I72 based on signals ADZ. Control signals I11, I12, I21, I22, I31, I32, I41, I42, I51, I52, I61, I62, I71, and I72 are provided to the gates of transistors 21A and 34A, 24A and 31A, 21B and 34B, 24B and 31B, 21C and 34C, 24C and 31C, 21D and 34D, 24D and 31D, 21E and 34E, 24E and 31E, 21F and 34F, 24F and 31F, 21G and 34G, and 24G and 31G, respectively. Select decoder circuit 510 causes the logic states of control signals I12, I22, I32, I42, I52, I62, and I72 to be inverted relative to the logic states of control signals I11, I21, I31, I41, I51, I61, and I71, respectively. Thus, control signals I11 and I12, I21 and I22, I31 and I32, I41 and I42, I51 and I52, I61 and I62, I71 and I72 are 7 complementary pairs of control signals.

The 7 complementary pairs of control signals I11/I12, I21/I22, I31/I32, I41/I42, I51/I52, I61/I62, and I71/I72 determine whether the 7 inverting buffers 2A-2G and the 7 inverting buffers 3A-3G, respectively, are on or off. Because the control signals are complementary, and each of the 14 control signals controls one p-channel transistor in a first inverting buffer and one n-channel transistor in a second inverting buffer, each of the 7 complementary pairs of control signals I11-I72 causes one inverting buffer to be on in stage A or C and one inverting buffer to be off in the other stage A or C.

In an exemplary embodiment of FIG. 5A, signals ADZ have 3 digital signals that can have 8 possible binary values. An example of how the control signals control buffers 2A-2G and 3A-3G is now provided for illustration. This example is not intended to be limiting. According to this example, select decoder circuit 510 causes a selected 7 of buffers 2A-2G and 3A-3G to be on and the remaining 7 of buffers 2A-2G and 3A-3G to be off in response to each of the binary values of signals ADZ. Select decoder circuit 510 turns on buffers 3A-3G in stage A and turns off buffers 2A-2G in stage C based on signals ADZ having a binary value of 000. Select decoder circuit 510 turns on buffers 2A and 3B-3G and turns off buffers 3A and 2B-2G based on signals ADZ having a binary value of 001. Select decoder circuit 510 turns on buffers 2A-2B and 3C-3G and turns off buffers 3A-3B and 2C-2G based on signals ADZ having a binary value of 010 (i.e., 2 in decimal). Select decoder circuit 510 turns on buffers 2A-2C and 3D-3G and turns off buffers 3A-3C and 2D-2G based on signals ADZ having a binary value of 011 (i.e., 3 in decimal). Select decoder circuit 510 turns on buffers 2A-2D and 3E-3G and turns off buffers 3A-3D and 2E-2G based on signals ADZ having a binary value of 100 (i.e., 4 in decimal). Select decoder circuit 510 turns on buffers 2A-2E and 3F-3G and turns off buffers 3A-3E and 2F-2G based on signals ADZ having a binary value of 101 (i.e., 5 in decimal). Select decoder circuit 510 turns on buffers 2A-2F and 3G and turns off buffers 3A-3F and 2G based on signals ADZ having a binary value of 110 (i.e., 6 in decimal). Select decoder circuit 510 turns on buffers 2A-2G and turns off buffers 3A-3G based on signals ADZ having a binary value of 111 (i.e., 7 in decimal).

Phase interpolator circuit 115 generates signals VS and CP based on a weighted average of the 3 voltage signals VA, VB, and VC. The weighted average of voltage signals VA, VB, and VC that phase interpolator 115 provides to the generation of signals VS and CP is based on the number of inverting buffers 1A-1H, 2A-2G, and 3A-3H that are on at any given time. Turning on more of the buffers that buffer a particular signal VB or VC increases the weighting of that signal in the generation of signal VS. Turning off more of the buffers that buffer a particular signal VB or VC decreases the weighting of that signal in the generation of signal VS.

As discussed above, all 8 buffers 1A-1H in stage B are always on during the operation of phase interpolator circuit 115. According to the example discussed above, decoder circuit 510 causes 7 of buffers 2A-2G and 3A-3G to be on and the remaining 7 buffers 2A-2G and 3A-3G to be off in response to each of the binary values of signals ADZ. In this example, stage B provides one-half (i.e., 50%) weighting of signal VB to the generation of signal VS, and stages A and C together provide one-half (i.e., 50%) weighting of signals VA and VC to the generation of signal VS.

The weighting that signal VB provides to the generation of signals VS and CP is a constant value of 50%. The weighting of each of signals VA and VC that phase interpolator circuit 115 uses to generate signals VS and CP varies based on changes in the binary value of signals ADZ. Phase interpolator circuit 115 generates signals VS and CP based on a unique weighting of each of signals VA and VC in response to each unique binary value of signals ADZ. The voltage waveform of signal VS may or may not equal the sum of the voltage waveforms of signals VA-VC after being multiplied by their respective weightings, depending on whether the buffers in stages A-C are linear or nonlinear.

Phase interpolator circuit 115 changes the weighting provided by each of signals VA and VC to the generation of signals VS and CP as the binary value of signals ADZ changes. Using one of the examples provided above, select decoder circuit 510 causes stage A to provide one-half weighting of signal VA to signal VS and causes stage C to provide zero weighting of signal VC to signal VS in response to signals ADZ having a binary value of 000. Using another example provided above, select decoder circuit 510 causes stage A to provide 31.25% weighting of signal VA to signal VS and causes stage C to provide 18.75% weighting of signal VC to signal VS in response to signals ADZ having a binary value of 011. Using yet another example provided above, select decoder circuit 510 causes stage A to provide 6.25% weighting of signal VA to signal VS and causes stage C to provide 43.75% weighting of signal VC to signal VS in response to signals ADZ having a binary value of 111.

The phase interpolator shown in FIG. 5A is merely one example of phase interpolator circuits 115A and 115B. Other configurations of phase interpolator circuits may be used to implement phase interpolator circuits 115A and 115B. The phase interpolator 115 shown in FIG. 5A may, for example, have more or less than 8 inverting buffers in each of the three stages A-C. In an alternative embodiment, each of the three stages A-C in phase interpolator circuit 115 may have 16 inverting buffers that are coupled in parallel between the node at the respective voltage signal VA-VC and the node at signal VS. If each of stages A-C has 16 inverting buffers, then signals ADZ have 4 signals that can indicate up to 16 unique binary values.

Figure 5B:
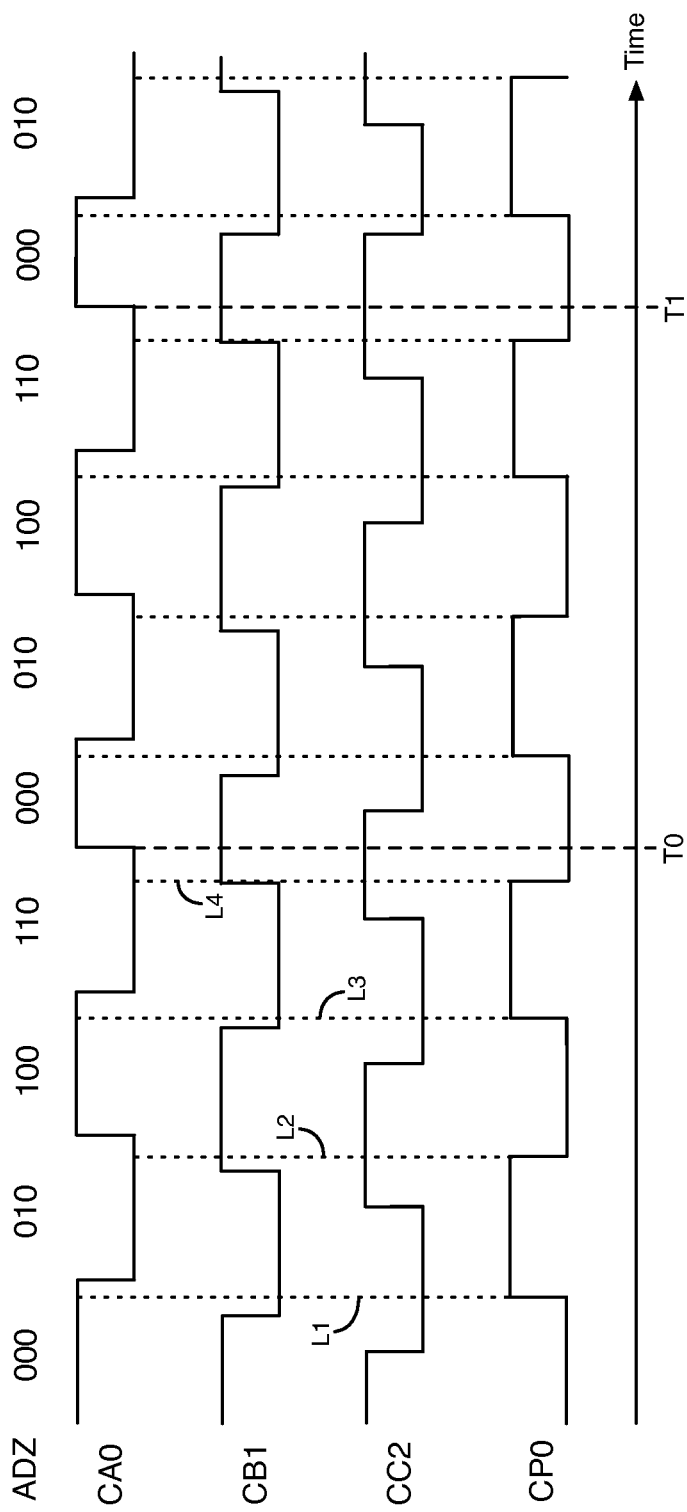
FIG. 5B is a timing diagram that illustrates examples of waveforms for the input signals and the output signal of one of the phase interpolator circuits of FIG. 1, according to an embodiment of the present invention.

FIG. 5B is a timing diagram that illustrates examples of waveforms for the input signals to and the output signal of phase interpolator circuit 115A of FIG. 1, according to an embodiment of the present invention. FIG. 5B illustrates examples of waveforms for the input signals CA0, CB1, and CC2 to phase interpolator circuit 115A and the output signal CP0 of phase interpolator circuit 115A.

Phase interpolator circuit 115A has the circuitry shown in FIG. 5A in the example of FIG. 5B. Phase interpolator circuit 115 shown in FIG. 5A inverts the input signals MA-MC three times. Inverters 501-503 provide the first inversion, stages A-C provide the second inversion, and inverter 504 provides the third inversion. Therefore, rising edges in signal CP are generated based on falling edges in signals MA-MC, and falling edges in signal CP are generated based on rising edges in signals MA-MC. Signals MA, MB, MC, and CP shown in FIG. 5A are signals CA0, CB1, CC2, and CP0, respectively, in FIG. 5B.

In the example of FIG. 5B, adder circuit 110 adds 2 to signals ADY/ADZ in each one-half period of clock signal CA0. Thus, the binary value of the least significant bit signals ADZ increases by 2 in each one-half period of signal CA0. In the example of FIG. 5B, signals ADZ include only 3 signals, and signals ADY include only 3 signals.

In response to each increase of 1 in the binary value of signals ADY, each of multiplexer circuits 101A-101F generates its respective output clock signal CA0, CB1, CC2, CA4, CB5, and CC6 based on an input clock signal having a phase that is 45° earlier than the phase of the input clock signal previously used to generate its respective output clock signal in the example of FIG. 5B. The binary value of signals ADY increases by 1 each time that the binary value of signals ADZ resets to 000. Because the binary value of signals ADZ changes by 2 in each half-period of signal CA0 in the example of FIG. 5B, multiplexer circuits 101A-101C reduce the periods of their respective output clock signals CA0, CB1, and CC2 by ⅛ of their periods after signals ADZ change from 110 to 000, as shown, e.g., after times T0 and T1 in FIG. 5B.

Each time that the binary value of signals ADZ resets to 000, phase interpolator circuit 115A causes the next logic state transition (i.e., rising or falling edge) of signal CP0 to occur earlier than the next logic state transition in signal CA0. As a result, phase interpolator circuit 115A is able to reduce duty cycle distortion in signal CP0 relative to its input signals CA0, CB1, and CC2, as shown in FIG. 5B. Phase interpolator circuit 115B is also able to reduce duty cycle distortion in its output signal CP1 relative to its input signals CA4, CB5, and CC6 for the same reasons.

In the example of FIG. 5B, phase interpolator 115 causes buffers 3A-3G in stage A to be on and buffers 2A-2G in stage C to be off in response to signals ADZ having a binary value of 000. As a result, the rising edge of signal CP0 that occurs when signals ADZ equal 0 is about halfway between the corresponding falling edges of signals CA0 and CB1, as shown by dotted line L1 in FIG. 5B.

In response to signals ADZ having a binary value of 010 (i.e., 2 in decimal), phase interpolator 115 causes buffers 2A-2B and 3C-3G to be on and buffers 3A-3B and 2C-2G to be off, in the example of FIG. 5B. As a result, the falling edge of signal CP0 that occurs when signals ADZ equal 010 occurs closer to the corresponding rising edge in signal CB1, as shown by the dotted line L2 in FIG. 5B.

In response to signals ADZ having a binary value of 100 (i.e., 4 in decimal), phase interpolator 115 causes buffers 2A-2D and 3E-3G to be on and buffers 3A-3D and 2E-2G to be off, in the example of FIG. 5B. As a result, the rising edge of signal CP0 that occurs when signals ADZ equal 100 occurs just after the corresponding falling edge in signal CB1, as shown by the dotted line L3 in FIG. 5B.

In response to signals ADZ having a binary value of 110 (i.e., 6 in decimal), phase interpolator 115 causes buffers 2A-2F and 3G to be on and buffers 3A-3F and 2G to be off, in the example of FIG. 5B. As a result, the falling edge of signal CP0 that occurs when signals ADZ equal 110 occurs very close to the corresponding rising edge in signal CB1, as shown by the dotted line L4 in FIG. 5B.

As shown, for example, in FIG. 5B, phase interpolator circuit 115 generates the rising and falling edges in its output signal CP based on different weightings of its input signals MA, MB, and MC in response to each unique binary value generated in signals ADZ. As adder circuit 110 continuously changes the binary value of signals ADZ, phase interpolator circuit 115 continuously changes the weightings of its input signals MA, MB, and MC that are used to generate its output signal CP.

Figure 6A:
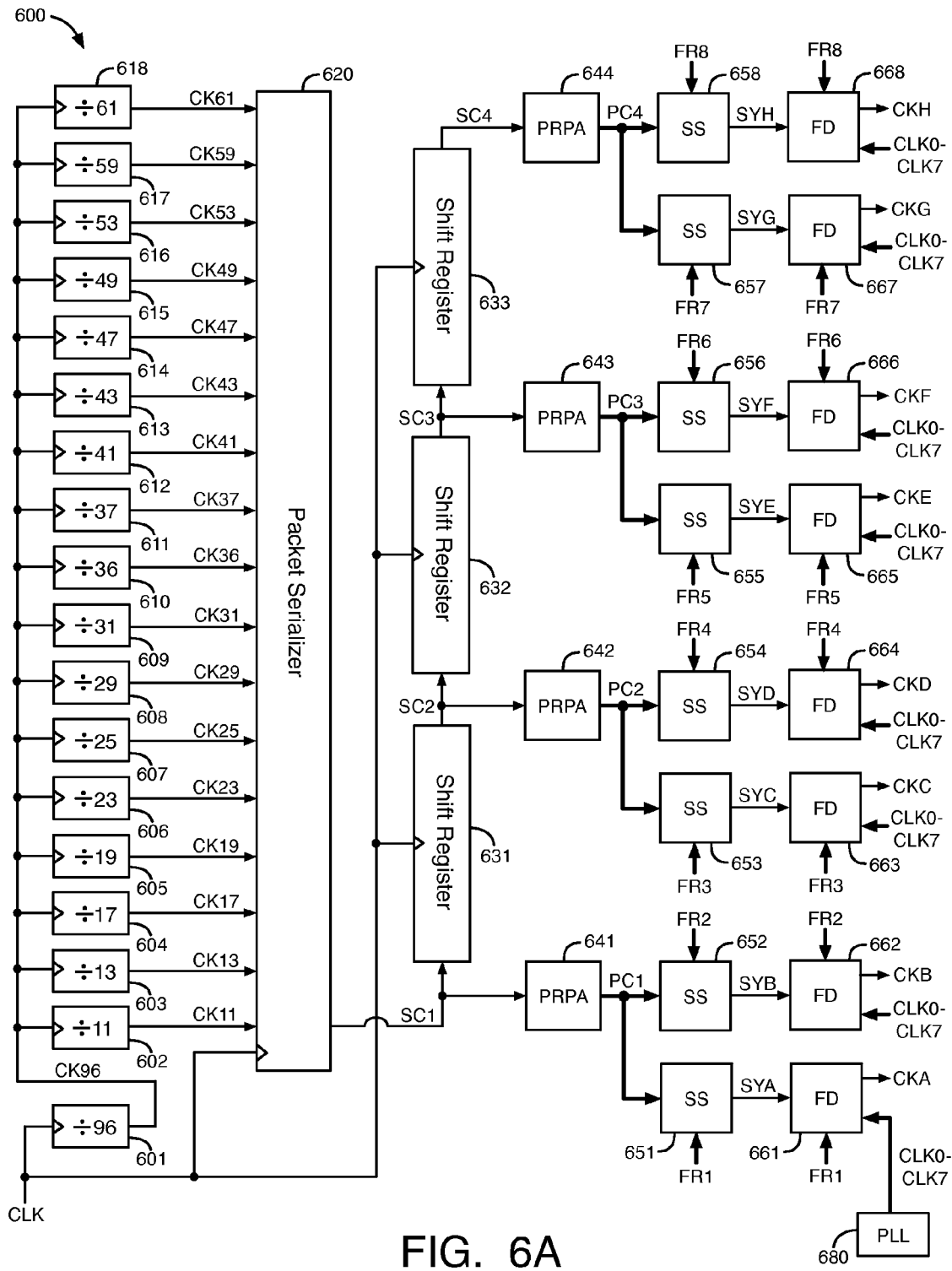
FIG. 6A illustrates an example of circuitry for synchronizing multiple frequency divider circuits, according to an embodiment of the present invention.

FIG. 6A illustrates an example of synchronization generator circuitry 600 for synchronizing multiple frequency divider circuits, according to an embodiment of the present invention. Synchronization generator circuitry 600 includes frequency divider circuits 601-618, packet serializer circuit 620, shift register circuits 631-633, packet reader and pipeline adjuster (PRPA) circuits 641-644, synchronization selector (SS) circuits 651-658, frequency divider (FD) circuits 661-668, and phase-locked loop (PLL) circuit 680.

Each of the 8 FD circuits 661-668 includes an instance of the frequency divider circuit 100 shown in FIG. 1. FD circuits 661-668 generate output clock signals CKA-CKH, respectively. Each of the output clock signals CKA-CKH within a respective one of the FD circuits 661-668 corresponds to output clock signal CKOUT shown in FIG. 1. Circuitry 600 synchronizes clock signals CKA-CKH according to predefined coarse and fine phase offsets, as described in further detail below.

PLL circuit 680 shown in FIG. 6A generates the eight clock signals CLK0-CLK7 that are described above with respect to FIG. 1. Clock signals CLK0-CLK7 are offset in phase at 45° phase intervals, as described above. The clock signals CLK0-CLK7 are provided to inputs of each of the 8 FD circuits 661-668.

Clock signal CLK shown in FIG. 6A may, for example, be one of clock signals CLK0-CLK7. Clock signal CLK is provided to clock inputs of frequency divider circuit 601, packet serializer circuit 620, and each of shift register circuits 631-633. Frequency divider circuit 601 generates an output clock signal CK96 in response to clock signal CLK. Frequency divider circuit 601 has a frequency division value of 96. Frequency divider circuit 601 divides the frequency of clock signal CLK by 96 to generate the frequency of clock signal CK96. Frequency divider circuit 601 causes the frequency of clock signal CK96 to equal the frequency of clock signal CLK divided by 96.

Clock signal CK96 is provided through conductors to an input of each of the 17 frequency divider circuits 602-618. Frequency divider circuits 602-618 have frequency division values of 11, 13, 17, 19, 23, 25, 29, 31, 36, 37, 41, 43, 47, 49, 53, 59, and 61, respectively, as shown in FIG. 6A. Frequency divider circuits 602-618 generate output clock signals CK11, CK13, CK17, CK19, CK23, CK25, CK29, CK31, CK36, CK37, CK41, CK43, CK47, CK49, CK53, CK59, and CK61, respectively. Frequency divider circuits 602-618 cause the frequencies of clock signals CK11, CK13, CK17, CK19, CK23, CK25, CK29, CK31, CK36, CK37, CK41, CK43, CK47, CK49, CK53, CK59, and CK61 to equal the frequency of clock signal CK96 divided by 11, 13, 17, 19, 23, 25, 29, 31, 36, 37, 41, 43, 47, 49, 53, 59, and 61, respectively.

The 17 clock signals CK11, CK13, CK17, CK19, CK23, CK25, CK29, CK31, CK36, CK37, CK41, CK43, CK47, CK49, CK53, CK59, and CK61 are provided to inputs of packet serializer circuit 620. Packet serializer circuit 620 generates an output signal SC1 that contains serial bits. Packet serializer circuit 620 samples each of the 17 clock signals CK11, CK13, CK17, CK19, CK23, CK25, CK29, CK31, CK36, CK37, CK41, CK43, CK47, CK49, CK53, CK59, and CK61 within each set of 96 consecutive periods of clock signal CLK to generate 17 sampled clock values that are output as serial bits in signal SC1. The 17 sampled clock values generated by packet serializer circuit 620 indicate the logic states of the 17 output clock signals of frequency divider circuits 602-618 within each set of 96 consecutive periods of clock signal CLK.

The serial bits in output signal SC1 are grouped into packets. The duration of each of the bits in output signal SC1 equals one period of clock signal CLK. Each packet of serial bits in signal SC1 contains 96 bits. Thus, the duration of each packet of serial bits in output signal SC1 equals 96 periods of clock signal CLK. The frequency division value of frequency divider circuit 601 is selected to be 96 to provide packet serializer circuit 620 with enough time to sample the 17 output clock signals of frequency divider circuits 602-618 and to output the 17 sampled clock values as 17 serial bits in a packet within each set of 96 consecutive periods of clock signal CLK.

Packet serializer circuit 620 generates a packet of serial bits in output signal SC1 that indicate a header and the 17 sampled clock values in response to each set of 96 consecutive periods of clock signal CLK. The header in each packet of serial bits in signal SC1 indicates the location of the 17 sampled clock values within that packet of serial bits in signal SC1. Each packet of serial bits in signal SC1 may also include additional filler bits that do not represent usable information. The additional filler bits in each packet are not used to indicate the header or the 17 sampled clock values.

Figure 6B:
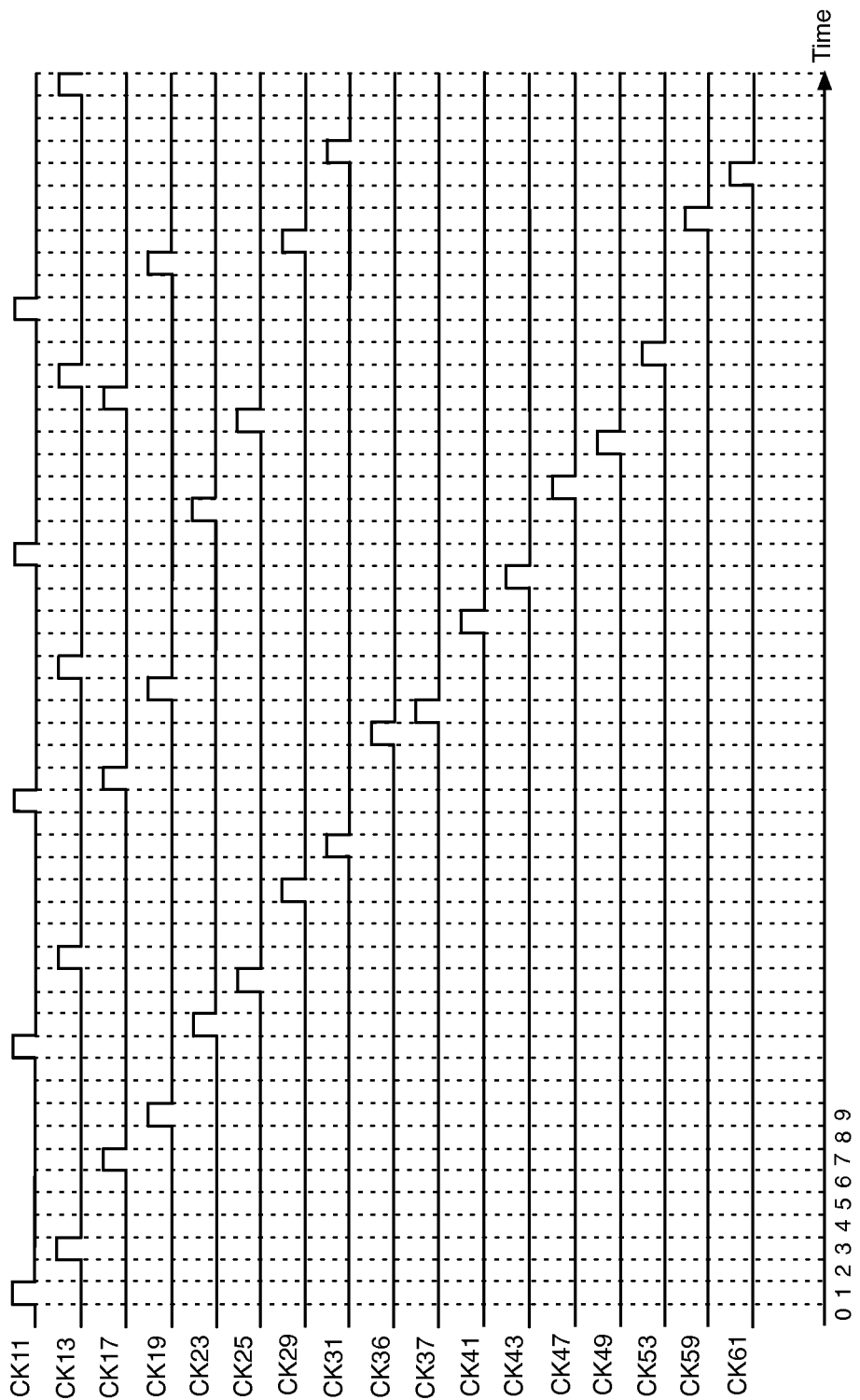
FIG. 6B is a timing diagram that illustrates examples of waveforms for the output clock signals of frequency divider circuits shown in FIG. 6A, according to an embodiment of the present invention.

FIG. 6B is a timing diagram that illustrates examples of waveforms for the 17 output clock signals of frequency divider circuits 602-618, according to an embodiment of the present invention. The exemplary waveforms shown in and described with respect to FIG. 6B are provided for the purpose of illustration and are not intended to be limiting. In the example of FIG. 6B, clock signals CK11, CK13, CK17, CK19, CK23, CK25, CK29, CK31, CK36, CK37, CK41, CK43, CK47, CK49, CK53, CK59, and CK61 have logic high pulses every 11, 13, 17, 19, 23, 25, 29, 31, 36, 37, 41, 43, 47, 49, 53, 59, and 61 periods of clock signal CK96, respectively. Each of the logic high pulses in clock signals CK11, CK13, CK17, CK19, CK23, CK25, CK29, CK31, CK36, CK37, CK41, CK43, CK47, CK49, CK53, CK59, and CK61 lasts for 1 period of clock signal CK96, in the example of FIG. 6B.

The time interval between each pair of adjacent vertical dotted lines in FIG. 6B is the duration of each packet of serial bits in signal SC1. Each packet of 96 serial bits in signal SC1 includes a header and 17 bits that indicate the logic states of the 17 clock signals generated by frequency divider circuits 602-618 within that packet.

Within the time period shown in the example of FIG. 6B, packet serializer circuit 620 generates 56 packets in 56 time intervals. Ten of the time intervals 0-9 are identified in FIG. 6B for the purpose of illustration. In each of time intervals 0, 2, 4-6, and 8 in FIG. 6B, packet serializer circuit 620 generates a packet having 17 zero bits indicating the logic low states of the 17 clock signals generated by frequency divider circuits 602-618. In time interval 1 in FIG. 6B, packet serializer circuit 620 generates a packet in signal SC1 having 17 bits 10000000000000000 indicating that clock signal CK11 is in a logic high state, and the remaining clock signals shown in FIG. 6B are in logic low states. In time interval 3 in FIG. 6B, packet serializer circuit 620 generates a packet in signal SC1 having 17 bits 01000000000000000 indicating that clock signal CK13 is in a logic high state, and the remaining clock signals shown in FIG. 6B are in logic low states. In time interval 7 in FIG. 6B, packet serializer circuit 620 generates a packet in signal SC1 having 17 bits 00100000000000000 indicating that clock signal CK17 is in a logic high state, and the remaining clock signals shown in FIG. 6B are in logic low states. In time interval 9 in FIG. 6B, packet serializer circuit 620 generates a packet in signal SC1 having 17 bits 00010000000000000 indicating that clock signal CK19 is in a logic high state, and the remaining clock signals shown in FIG. 6B are in logic low states.

Eight sets of parallel signals FR1-FR8 are provided to the 8 frequency divider circuits 661-668, respectively, as shown in FIG. 6A. Signals FR1-FR8 correspond to signals FR in FIG. 1 for frequency divider circuits 661-668, respectively. Signals FR1-FR8 indicate the fractional numbers that are part of the frequency division values used to generate output clock signals CKA-CKH, respectively, as described above. The INT signals indicating the integer numbers that are part of the frequency division values used to generate clock signals CKA-CKH are not shown in FIG. 6A.

The frequency division values 11, 13, 17, 19, 23, 25, 29, 31, 36, 37, 41, 43, 47, 49, 53, 59, and 61 of frequency divider circuits 602-618 are prime numbers or multiples of prime numbers from 2 to 61. The number 25 is a multiple of 5. The number 36 is a multiple of 2 and 3. The number 49 is a multiple of 7. The numbers 11, 13, 17, 19, 23, 29, 31, 37, 41, 43, 47, 53, 59, and 61 are prime numbers. The frequency division values of frequency divider circuits 602-618 are selected to be prime numbers or multiples of prime numbers from 2 to 61 so that circuitry 600 is able to synchronize clock signals CKA-CKH if the binary value of each of the 8 sets of signals FR1-FR8 is equal to or a multiple of any of the prime numbers from 2 to 61. Therefore, circuitry 600 provides a wide range of numbers that can be used as fractional frequency division values to generate clock signals CKA-CKH, while allowing circuitry 600 to synchronize clock signals CKA-CKH according to predefined phase shifts.

Signal SC1 is provided to an input of shift register circuit 631 and to an input of packet reader and pipeline adjuster (PRPA) circuit 641, as shown in FIG. 6A. Each of the three shift register circuits 631-633 is a serial-in, serial-out (SISO) shift register. Each of the three shift register circuits 631-633 may have any number of serially coupled flip-flop circuits. For example, each of the three shift register circuits 631-633 may have 8 serially coupled flip-flop circuits. As another example, each of the three shift register circuits 631-633 may have 24 serially coupled flip-flop circuits.

Shift register circuit 631 shifts each serial bit in signal SC1 in serial through its serially coupled flip-flop circuits in response to clock signal CLK to generate serial bits in output signal SC2. Signal SC2 contains the same serial bits as signal SC1 in the same order, but the bits in signal SC2 are delayed relative to the corresponding bits in signal SC1. Signal SC2 is provided to an input of shift register circuit 632 and to an input of packet reader and pipeline adjuster (PRPA) circuit 642, as shown in FIG. 6A.

Shift register circuit 632 shifts each serial bit in signal SC2 in serial through its serially coupled flip-flop circuits in response to clock signal CLK to generate serial bits in output signal SC3. Signal SC3 contains the same serial bits as signal SC2 in the same order, but the bits in signal SC3 are delayed relative to the corresponding bits in signal SC2. Signal SC3 is provided to an input of shift register circuit 633 and to an input of packet reader and pipeline adjuster (PRPA) circuit 643, as shown in FIG. 6A.

Shift register circuit 633 shifts each serial bit in signal SC3 in serial through its serially coupled flip-flop circuits in response to clock signal CLK to generate serial bits in output signal SC4. Signal SC4 contains the same serial bits as signal SC3 in the same order, but the bits in signal SC4 are delayed relative to the corresponding bits in signal SC3. Signal SC4 is provided to an input of packet reader and pipeline adjuster (PRPA) circuit 644, as shown in FIG. 6A.

PRPA circuits 641, 642, 643, and 644 generate 4 sets of parallel output signals PC1, PC2, PC3, and PC4 based on the serial input signals SC1, SC2, SC3, and SC4, respectively. Each of the PRPA circuits 641, 642, 643, and 644 includes a serial-to-parallel converter circuit. The serial-to-parallel converter circuits in PRPA circuits 641, 642, 643, and 644 convert the serial bits that indicate the sampled clock values in signals SC1, SC2, SC3, and SC4 to parallel bits in output signals PC1, PC2, PC3, and PC4, respectively. The serial-to-parallel converter circuits in PRPA circuits 641-644 use the headers in signals SC1-SC4, respectively, to determine the locations of the 17 sampled clock values within each packet of serial bits. Each of the four sets of signals PC1, PC2, PC3, and PC4 has 17 parallel signals that indicate the 17 sampled clock values in each packet. The serial-to-parallel converter circuits in PRPA circuits 641-644 do not convert the header bits or the filler bits in each packet into parallel bits in signals PC1-PC4, respectively. Each of the serial-to-parallel converter circuits in PRPA circuits 641-644 provides about the same delay to the parallel bits in the respective set of signals PC1-PC4.

Each of the three PRPA circuits 641, 642, and 643 includes a delay circuit. The delay circuits in PRPA circuits 641, 642, and 643 provide additional delay to the parallel bits in output signals PC1, PC2, and PC3 relative to the serial bits in signals SC1, SC2, and SC3, respectively, to compensate for the delays of shift register circuits 631-633, as described below. The delay circuits in PRPA circuits 641-643 cause the parallel bits in signals PC1-PC4 to indicate the same set of 17 sampled clock values in the same packet at the same time.

The delay circuit in PRPA circuit 641 delays the parallel bits in signals PC1 by a delay equal to the combined delay that shift register circuits 631-633 provide to the serial bits in signal SC4 relative to the corresponding serial bits in signal SC1. The delay circuit in PRPA circuit 642 delays the parallel bits in signals PC2 by a delay equal to the combined delay that shift register circuits 632-633 provide to the serial bits in signal SC4 relative to the corresponding serial bits in signal SC2. The delay circuit in PRPA circuit 643 delays the parallel bits in signals PC3 by a delay equal to the delay that shift register circuit 633 provides to the serial bits in signal SC4 relative to the corresponding serial bits in signal SC3.

Each of the PRPA circuits 641, 642, and 643 also includes a counter circuit and a programmable register circuit. Each of the programmable register circuits stores a delay value. The delay values stored in the programmable register circuits determine the delays that the delay circuits in PRPA circuits 641, 642, and 643 provide to the parallel bits in signals PC1, PC2, and PC3 relative to the serial bits in signals SC1, SC2, and SC3, respectively. The delay values stored in the programmable register circuits can be reprogrammed to different delay values.

The counter circuit in each of the PRPA circuits 641-643 receives the delay value that is stored in its respective programmable register circuit. The counter circuit in each of the PRPA circuits 641-643 generates count signals. In an embodiment, the counter circuit in each of the PRPA circuits 641-643 increases the binary value of its count signals by 1 in each period of clock signal CLK from zero up to the delay value. The counter circuit then resets its count signals to zero. In an alternative embodiment, the counter circuit in each of PRPA circuits 641-643 decrements its count signals from the delay value to zero in each period of clock signal CLK. The delay circuit in each of PRPA circuits 641-643 delays the parallel bits in the respective set of signals PC1-PC3 based on the binary value of the count signals from the respective counter circuit changing by the delay value.

Parallel signals PC1 are provided to inputs of each of synchronization selector (SS) circuits 651-652. Parallel signals PC2 are provided to inputs of each of synchronization selector (SS) circuits 653-654. Parallel signals PC3 are provided to inputs of each of synchronization selector (SS) circuits 655-656. Parallel signals PC4 are provided to inputs of each of synchronization selector (SS) circuits 657-658. The eight sets of parallel signals FR1-FR8 are provided to additional inputs of SS circuits 651-658, respectively, as shown in FIG. 6A.

SS circuits 651-658 generate 8 sync signals SYA-SYH, respectively. SS circuits 651-658 generate sync signals SYA-SYH based on the binary values of signals FR1-FR8, respectively. SS circuits 651 and 652 each select one of the 17 parallel signals PC1 based on signals FR1 and FR2 to generate sync signals SYA and SYB, respectively. SS circuits 653 and 654 each select one of the 17 parallel signals PC2 based on signals FR3 and FR4 to generate sync signals SYC and SYD, respectively. SS circuits 655 and 656 each select one of the 17 parallel signals PC3 based on signals FR5 and FR6 to generate sync signals SYE and SYF, respectively. SS circuits 657 and 658 each select one of the 17 parallel signals PC4 based on signals FR7 and FR8 to generate sync signals SYG and SYH, respectively.

Each of the SS circuits 651-658 includes a look-up table (LUT) circuit. The LUT circuits in SS circuits 651-658 store selection values. Each of the selection values corresponds to a different binary value of signals FR1-FR8. The LUT circuits in SS circuits 651-658 generate selection signals that indicate the selection values corresponding to the binary values of the respective sets of signals FR1-FR8. SS circuits 651-658 use the selection signals to select which of the 17 parallel signals in the received set of signals PC1-PC4 to use to generate sync signals SYA-SYH, respectively. The binary value of each of the 8 sets of signals FR1-FR8 equals a prime number from 2 to 61 or a multiple of a prime number from 2 to 61.

Each of the SS circuits 651-658 causes its respective output sync signal SYA-SYH to have the same waveform and the same period as the signal selected from the received set of signals PC1-PC4. Sync signals SYA-SYH are provided to the inputs of FD circuits 661-668, respectively. FD circuits 661-668 use sync signals SYA-SYH to synchronize clock signals CKA-CKH, respectively, as described in further detail below with respect to FIG. 7. The selection values stored in the LUT circuits are selected to cause the SS circuits 651-658 to select sync signals SYA-SYH having periods that are multiples of the binary values of signals FR1-FR8, respectively.

Circuitry 600 is shown in FIG. 6A as having 8 frequency divider circuits 661-668 as an example. According to various embodiments, circuitry 600 may synchronize the output clock signals of any number of frequency divider circuits. The frequency divider circuits receive sync signals from a corresponding number of synchronization selector circuits. As another specific example, circuitry 600 may be used to synchronize the output clock signals of 96 frequency divider circuits that receive sync signals from 96 synchronization selector circuits.

According to other embodiments, circuitry 600 may provide the serial bits indicated by signals SC4 through one or more additional shift register circuits to one or more additional PRPA circuits. The additional PRPA circuits provide delay compensation to the serial bits and convert the serial bits into parallel signals. The parallel signals are provided to additional synchronization selector circuits. The additional synchronization selector circuits generate sync signals for additional frequency divider circuits, as described above. In this embodiment, PRPA circuit 644 includes a counter circuit, a programmable register circuit, and a delay circuit that function as described above. The delay values stored in the programmable register circuits in the PRPA circuits are selected to compensate for delays of the shift register circuits, so that each of the PRPA circuits outputs the same sampled clock values at the same time.

According to further embodiments, circuitry 600 may include additional frequency divider circuits having frequency division values of additional prime numbers greater than 61. The additional frequency divider circuits provide their frequency divided output clock signals to packet serializer circuit 620 to sample for generating additional serial bits in signal SC1.

According to still further embodiments, circuitry 600 may include two or more packet serializer circuits. Each of the packet serializer circuits generates an output signal having serial bits that indicate the sampled clock values of multiple frequency divided clock signals, as described above with respect to packet serializer circuit 620. The serial bits generated by each of the packet serializer circuits are provided to each of the PRPA circuits 641-644 for delay compensation and for conversion to parallel signals. The SS circuits 651-658 select among the parallels signals representing the sampled clock values from the multiple packet serializer circuits to generate their respective sync signals SYA-SYH. The additional packet serializer circuits may provide the SS circuits 651-658 with more periodic signals having a greater variety of periods to use to generate the sync signals SYA-SYH, respectively.

Figure 7:
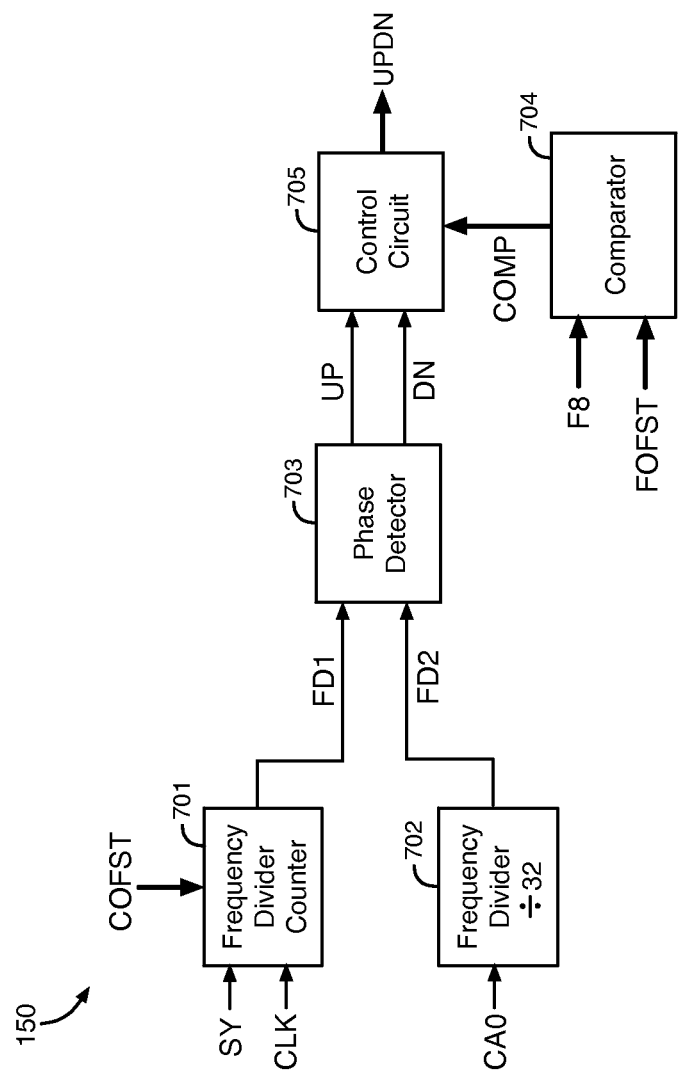
FIG. 7 illustrates an example of a synchronization detector circuit in the frequency divider circuit of FIG. 1, according to an embodiment of the present invention.

FIG. 7 illustrates an example of a synchronization (sync) detector circuit 150, according to an embodiment of the present invention. Sync detector circuit 150 as shown in FIG. 7 is an example of the sync detector circuit 150 shown in FIG. 1. Each of the FD circuits 661-668 includes a sync detector circuit 150. Referring to FIG. 7, sync detector circuit 150 includes counter circuit 701, frequency divider circuit 702, phase detector circuit 703, comparator circuit 704, and control circuit 705.

Counter circuit 701 functions as a frequency divider circuit. Frequency divider circuits, such as circuits 701-702, may also be clock divider circuits if they are used to divide the frequencies of clock signals. Sync signal SY, clock signal CLK, and coarse offset signals COFST are provided to inputs of counter circuit 701. Sync signal SY is one of the sync signals SYA-SYH that is generated by a respective one of SS circuits 651-658 and provided to a respective one of FD circuits 661-668 shown in FIG. 6A. Clock signal CLK in FIG.

7 is the same clock signal CLK shown in FIG. 6A that is generated by PLL circuit 680. The binary value of digital coarse offset signals COFST indicates a coarse phase offset value.

Counter circuit 701 generates a periodic output signal FD1 based on sync signal SY, clock signal CLK, and coarse offset signals COFST. Counter circuit 701 divides the frequency of clock signal CLK by a frequency division value N to generate the frequency of signal FD1. Counter circuit 701 causes the frequency of signal FD1 to equal the frequency of clock signal CLK divided by the frequency division value N.

Counter circuit 701 generates count signals. Counter circuit 701 initializes the binary value of its count signals to equal the binary value of the coarse offset signals COFST. Counter circuit 701 then increments or decrements the binary value of its count signals in each period of clock signal CLK. When the binary value of the count signals equals the frequency division value N, counter circuit 701 resets the binary value of its count signals to zero. Counter circuit 701 then increments or decrements the binary value of its count signals again in each period of clock signal CLK until its count signals equal N, and then counter circuit 701 is reset again and the counting process repeats.

Signal FD1 may indicate the most significant bit of the count signals generated by counter circuit 701. Counter circuit 701 aligns the phase of signal FD1 with the rising edges of the logic high pulses in the sync signal SY. Signal FD1 is provided to a first input of phase detector circuit 703.

Frequency divider circuit 702 receives clock signal CA0 from multiplexer circuit 101A. Frequency divider circuit 702 generates a periodic output signal FD2 based on clock signal CA0. Frequency divider circuit 702 may be a counter circuit or another type of frequency divider circuit. Frequency divider circuit 702 divides the frequency of clock signal CA0 by 32 to generate the frequency of signal FD2. Frequency divider circuit 702 causes the frequency of signal FD2 to equal the frequency of clock signal CA0 divided by 32. Signal FD2 is provided to a second input of phase detector circuit 703.

The frequency division value N of counter circuit 701 equals 32 times the fractional number F that is part of the frequency division value of circuit 100. Thus, the frequency division value N of counter circuit 701 is selected to equal 32×F. By selecting N to equal 32×F, frequency divider circuit 701 causes the period of signal FD1 to equal the period of signal FD2 when the period of clock signal CA0 is constant. As an example that is not intended to be limiting, if the fractional number F that is part of the frequency division value of circuit 100 is 1.25, then the frequency division value N of counter circuit 701 equals 40 (i.e., 1.25×32).

Phase detector circuit 703 compares the phase of signal FD1 to the phase of signal FD2 to generate phase error signals UP and DN. Phase detector circuit 703 asserts the phase error signal UP and de-asserts the phase error signal DN in response to the phase of signal FD1 occurring before the phase of signal FD2. Phase detector circuit 703 asserts the phase error signal DN and de-asserts the phase error signal UP in response to the phase of signal FD1 occurring after the phase of signal FD2. Phase detector circuit 703 de-asserts both of the phase error signals UP and DN in response to the phases of signals FD1 and FD2 being aligned within a phase margin.

Phase error signals UP and DN are provided to inputs of control circuit 705. Control circuit 705 generates control signals UPDN based on the phase error signals UP and DN. Control circuit 705 causes the control signals UPDN to indicate a value of +1 in binary in response to phase error signal UP being asserted. Control circuit 705 causes the control signals UPDN to indicate a value of −1 in binary in response to phase error signal DN being asserted. Control circuit 705 causes the control signals UPDN to indicate a value of 0 in binary in response to both of phase error signals UP and DN being de-asserted. The UPDN control signals are provided to inputs of adder circuit 110, as shown in and discussed above with respect to FIG. 1.

As described above with respect to FIG. 2, compressor circuit 210 adds the binary values of signals F3, signals F4, signals F5, and signals UPDN to generate a sum indicated by signals A1 and signals A2 in each period of clock signal CA0. When the binary value of the UPDN signals equals zero, adder circuit 200 adds twice the binary value of signals FR to the binary value of signals F8 at each rising edge of clock signal CA0, and adder circuit 200 adds twice the binary value of signals FR to the binary value of signals F10 at each falling edge of clock signal CA0, as described above.

When the value of the UPDN signals equals +1 in binary, adder circuit 200 adds 1 plus twice the binary value of signals FR to the binary value of signals F8 at each rising edge of clock signal CA0, and adder circuit 200 adds 1 plus twice the binary value of signals FR to the binary value of signals F10 at each falling edge of clock signal CA0. Adding an extra 1 to the binary value of each set of signals F8 and F10 in each period of clock signal CA0 increases the frequency of clock signal CA0.

When the value of the UPDN signals equals −1 in binary, adder circuit 200 adds twice the binary value of signals FR minus 1 to the binary value of signals F8 at each rising edge of clock signal CA0, and adder circuit 200 adds twice the binary value of signals FR minus 1 to the binary value of signals F10 at each falling edge of clock signal CA0. Subtracting an extra 1 from the binary value of each set of signals F8 and F10 in each period of clock signal CA0 decreases the frequency of clock signal CA0.

Frequency divider circuit 702 varies the frequency of signal FD2 in proportion to the changes in the frequency of clock signal CA0. Sync detector circuit 150 continues to generate a +1 or −1 in the UPDN signals to increase or decrease, respectively, the frequency of clock signal CA0, until the phase of signal FD2 is aligned with the phase of signal FD1 within a phase margin. Phase detector circuit 703 de-asserts both of the phase error signals UP and DN in response to the phases of signals FD1 and FD2 being aligned within the phase margin. Control circuit 705 then causes the control signals UPDN to indicate a value of 0 in binary in response to phase error signals UP and DN both being de-asserted. In response to the control signals UPDN indicating a value of 0 in binary, adder circuit 110/200 causes the frequency of clock signal CA0 to return to its normal frequency, which is the same frequency clock signal CA0 had before the UPDN signals indicated a non-zero value.

Because counter circuit 701 aligns the phase of signal FD1 with the rising edges of the logic high pulses in the sync signal SY, sync detector circuit 150 causes clock signal CA0 to have a phase alignment that is based on the phase of the sync signal SY. The coarse phase offset value indicated by the coarse offset signals COFST determines a coarse phase offset for the clock signal CA0 relative to the phase of the sync signal SY. After phase detector circuit 703 has de-asserted both of phase error signals UP and DN indicating that the phases of signals FD1 and FD2 are aligned within the phase margin, control circuit 705 no longer adjusts control signals UPDN based on signals UP and DN. Control circuit 705 effectively disables phase detector circuit 703 after the coarse phase offset has been achieved in clock signal CA0.

After the coarse phase offset has been achieved for clock signal CA0 using phase detector 703, control circuit 705 adjusts control signals UPDN based on comparison signals COMP. Comparison signals COMP are generated by comparison circuit 704 based on a fine phase offset for clock signal CA0. Sync detector circuit 150 receives fine offset signals FOFST. The fine offset signals FOFST indicate the fine phase offset for clock signal CA0. The total phase offset between the sync signal SY and the clock signal CA0 is determined by the coarse phase offset and the fine phase offset.

Referring to FIG. 7, the fine offset signals FOFST are provided in parallel to first inputs of comparator circuit 704. Signals F8 generated by adder circuit 200 are provided in parallel to second inputs of comparator circuit 704. Comparator circuit 704 compares the binary value of the fine offset signals FOFST to the binary value of signals F8 to generate the comparison signals COMP. The comparison signals COMP are provided to additional inputs of control circuit 705.

If the comparison signals COMP generated by comparator circuit 704 indicate that the binary value of signals F8 is less than the binary value of signals FOFST, then control circuit 705 causes the UPDN signals to indicate a value of +1 in binary. If the comparison signals COMP generated by comparator circuit 704 indicate that the binary value of signals F8 is greater than the binary value of signals FOFST, then control circuit 705 causes the UPDN signals to indicate a value of −1 in binary. If the comparison signals COMP generated by comparator circuit 704 indicate that the binary value of signals F8 equals the binary value of signals FOFST, then control circuit 705 causes the UPDN signals to indicate a value of 0 in binary.

Adder circuit 200 causes the frequency of clock signal CA0 to decrease in response to the UPDN signals having a value of −1 in binary. Adder circuit 200 causes the frequency of clock signal CA0 to increase in response to the UPDN signals having a value of +1 in binary. Adder circuit 200 maintains the average frequency of clock signal CA0 constant in response to the UPDN signals having a value of 0 in binary. In this way, control circuit 705 and comparator circuit 704 are able to adjust the frequency of clock signal CA0 in response to the fine offset signals FOFST.

After the coarse phase offset and the fine phase offset have both been achieved for clock signal CA0, the clock signal CA0 has a phase offset relative to the sync signal SY that is based on the binary values of the coarse offset signals COFST and the fine offset signals FOFST. The phases of each of the clock signals CB1, CC2, CA4, CB5, and CC6 are also adjusted based on the offset signals COFST and FOFST, because multiplexer circuits 101B-101F determine the phases of clock signals CB1, CC2, CA4, CB5, and CC6, respectively, based on signals ADY. The binary value of signals ADY changes based on changes in the UPDN control signals, which are adjusted based on the offset signals COFST and FOFST, as described above. Also, the phases of the output clock signals of phase interpolator circuits 115A-115B are adjusted based on the offset signals COFST and FOFST, because phase interpolator circuits 115A-115B determine the phases of their output clock signals CP0-CP1, respectively, based on clock signals CA0, CB1, CC2, CA4, CB5, and CC6 and based on signals ADZ. The binary value of signals ADZ changes based on changes in the UPDN control signals, which are adjusted based on the offset signals COFST and FOFST. Also, the phase of output clock signal CKOUT of circuit 100 changes based on changes in the phases of clock signals CP0-CP1.

Referring to FIG. 6A, the sync signals SYA-SYH can be used to synchronize the output clock signals CKA-CKH of FD circuits 661-668, respectively, to relative phase offsets with each other that are determined by offset signals COFST and FOFST. Each of the FD circuits 661-668 receives a different set of coarse offset signals COFST1-COFST8 and a different set of fine offset signals FOFST1-FOFST8, respectively. As a result, the relative phase offset between each pair of two of the clock signals CKA-CKH can be programmed to zero or to any non-zero value by selecting appropriate values for each set of the offset signals COFST1-COFST8 and FOFST1-FOFST8.

As an example, if the offset signals COFST1-COFST8 and FOFST1-FOFST8 provided to FD circuits 661-668 are selected to generate zero phase offsets for each of the clock signals CKA-CKH, respectively, then the sync signals SYA-SYH align the phases of the 8 clock signals CKA-CKH. Alternatively, the offset signals COFST1-COFST8 and FOFST1-FOFST8 provided to FD circuits 661-668 can be selected to generate non-zero phase offsets between two or more of the clock signals CKA-CKH, respectively. For example, if the offset signals COFST1-COFST8 and FOFST1-FOFST8 provided to FD circuits 661-668 are selected to generate 45° phase offsets between adjacent ones of clock signals CKA-CKH, respectively, then the sync signals SYA-SYH cause clock signals CKA-CKH to be offset at one-eighth period phase intervals.

Figure 8:
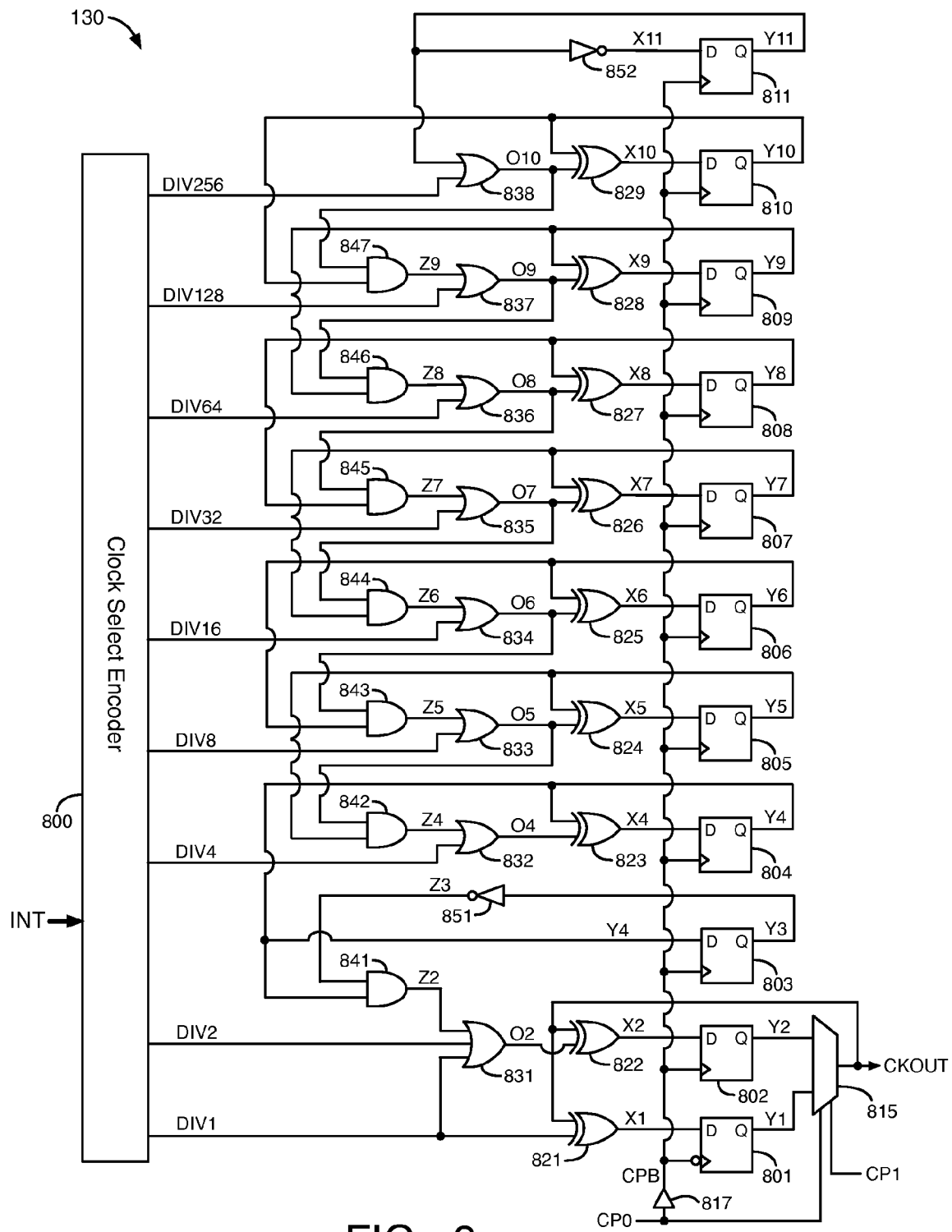
FIG. 8 illustrates an example of a frequency divider circuit in the frequency divider circuit of FIG. 1, according to an embodiment of the present invention.

FIG. 8 illustrates an example of frequency divider circuit 130, according to an embodiment of the present invention. Frequency divider circuit 130 is part of frequency divider circuit 100, as shown in FIG. 1. In the embodiment of FIG. 8, frequency divider circuit 130 includes clock select encoder circuit 800, D flip-flop circuits 801-811, XOR logic gate circuits 821-829, OR logic gate circuits 831-838, AND logic gate circuits 841-847, multiplexer circuit 815, buffer circuit 817, and inverter circuits 851-852.

Complementary clock signals CP0 and CP1 are provided to select inputs of multiplexer circuit 815. Complementary clock signals CP0 and CP1 are used as complementary select input signals of multiplexer circuit 815 to reduce duty cycle distortion in the output clock signal CKOUT.

Buffer circuit 817 buffers clock signal CP0 to generate buffered clock signal CPB. Buffered clock signal CPB is provided to the inverting clock input of flip-flop circuit 801. Buffered clock signal CPB is provided to the non-inverting clock input of each of flip-flop circuits 802-811. The output clock signal CKOUT of circuit 100 is generated at the output of multiplexer circuit 815.

Frequency divider circuit 130 divides the frequency of clock signal CP0 by one of the integers 1, 2, 4, 8, 16, 32, 64, 128, or 256 to generate the frequency of output clock signal CKOUT. Frequency divider circuit 130 causes the frequency of clock signal CKOUT to equal the frequency of clock signal CP0 divided by a frequency division value equal to one of the nine integers 1, 2, 4, 8, 16, 32, 64, 128, or 256. The binary value of signals INT determines the frequency division value of frequency divider circuit 130. The frequency of clock signal CP0 equals the frequency of clock signal CP1.

Clock select encoder circuit 800 encodes the binary value of signals INT to generate signals DIV1, DIV2, DIV4, DIV8, DIV16, DIV32, DIV64, DIV128, and DIV256. Clock select encoder circuit 800 causes only one of the nine signals DIV1, DIV2, DIV4, DIV8, DIV16, DIV32, DIV64, DIV128, or DIV256 to be in a logic high state in response to each of nine binary values of signals INT. Clock select encoder circuit 800 causes the remaining 8 of the signals DIV1, DIV2, DIV4, DIV8, DIV16, DIV32, DIV64, DIV128, and DIV256 to be in logic low states. Clock select encoder circuit 800 asserting signal DIV1, DIV2, DIV4, DIV8, DIV16, DIV32, DIV64, DIV128, or DIV256 to a logic high state causes the frequency division value of frequency divider circuit 130 to equal 1, 2, 4, 8, 16, 32, 64, 128, or 256, respectively.

Signals CKOUT and O2 are provided to inputs of XOR gate circuit 822. Signals DIV1 and CKOUT are provided to inputs of XOR gate 821. The output signals X1 and X2 of XOR gate circuits 821-822 are provided to the D inputs of flip-flop circuits 801-802. Multiplexer circuit 815 provides the logic state of signal Y2 to clock signal CKOUT in response to a logic low state in clock signal CP0 and a logic high state in clock signal CP1. Multiplexer circuit 815 provides the logic state of signal Y1 to clock signal CKOUT in response to a logic high state in clock signal CP0 and a logic low state in clock signal CP1.

When signal DIV1 is in a logic high state, frequency divider circuit 130 causes the frequency of clock signal CKOUT to equal the frequency of clock signal CP0. OR gate circuit 831 generates a logic high state in its output signal O2 in response to the logic high state in signal DIV1. In response to a falling edge in clock signal CKOUT, XOR gate circuits 821-822 generate rising edges in signals X1 and X2, and flip-flop circuits 801-802 generate rising edges at their Q outputs in signals Y1 and Y2 at the next falling edge and the next rising edge, respectively, of clock signal CPB. Signals Y1 and Y2 are provided to the multiplexing inputs of multiplexer circuit 815. Multiplexer circuit 815 then generates a rising edge in clock signal CKOUT based on the logic high state at one of its multiplexing inputs. In response to a rising edge in clock signal CKOUT, XOR gate circuits 821-822 generate falling edges in signals X1 and X2, and flip-flop circuits 801-802 generate falling edges at their Q outputs in signals Y1 and Y2 at the next falling edge and the next rising edge, respectively, of clock signal CPB. Multiplexer circuit 815 then generates a falling edge in clock signal CKOUT based on the logic low state at one of its multiplexing inputs.

When signal DIV2 is in a logic high state, frequency divider circuit 130 causes the frequency of clock signal CKOUT to equal one-half of the frequency of clock signal CP0. OR gate circuit 831 generates a logic high state in signal O2 in response to the logic high state in signal DIV2. In response to a falling edge in clock signal CKOUT, XOR gate circuits 821-822 generate falling and rising edges in signals X1 and X2, respectively, and flip-flop circuits 801-802 generate falling and rising edges in signals Y1 and Y2 at the next falling edge and the next rising edge, respectively, of clock signal CPB. Multiplexer circuit 815 then generates a rising edge in clock signal CKOUT in response to the next falling edge of clock signal CP0 and the next rising edge of clock signal CP1 after signal Y2 goes high. In response to a rising edge in clock signal CKOUT, XOR gate circuits 821-822 generate rising and falling edges in signals X1 and X2, respectively, and flip-flop circuits 801-802 generate rising and falling edges in signals Y1 and Y2 at the next falling edge and the next rising edge, respectively, of clock signal CPB. Multiplexer circuit 815 then generates a falling edge in clock signal CKOUT in response to the next falling edge of clock signal CP0 and the next rising edge of clock signal CP1 after signal Y2 goes low.

When signal DIV4 is in a logic high state, frequency divider circuit 130 causes the frequency of clock signal CKOUT to equal one-quarter of the frequency of clock signal CP0. OR gate circuit 832 generates a logic high state in signal O4 in response to the logic high state in signal DIV4. In response to a logic low state in signal Y4, XOR gate 823 generates a logic high state in signal X4, and flip-flop circuit 804 generates a rising edge at its Q output in signal Y4 at the next rising edge in clock signal CPB. In response to a rising edge in signal Y4, XOR gate 823 generates a falling edge in signal X4, and flip-flop circuit 804 generates a falling edge at its Q output in signal Y4 at the next rising edge in clock signal CPB.

Signal Y4 is also provided to a first input of AND gate circuit 841 and to the D input of flip-flop circuit 803. Flip-flop circuit 803 stores the logic state of signal Y4 at its Q output in signal Y3 at each rising edge of clock signal CPB. Inverter circuit 851 inverts the logic state of signal Y3 to generate signal Z3, which is provided to a second input of AND gate circuit 841. AND gate circuit 841 generates its output signal Z2 by performing an AND Boolean logic function on the logic states of signals Z3 and Y4. Signal Z2 is provided to an input of OR gate circuit 831.

When signal Z2 is in a logic high state, OR gate circuit 831 causes signal O2 to be in a logic high state, and circuits 821-822, 801-802, and 815 function as described above with respect to signal DIV2 being in a logic high state. When signal Z2 is in a logic low state, and signals DIV1 and DIV2 are also in logic low states, OR gate circuit 831 causes signal O2 to be in a logic low state. When signals O2 and DIV1 are both in logic low states, and clock signal CKOUT is in a logic low state, then clock signal CKOUT remains in a logic low state, until after rising edges occur in signals Z2 and O2.

When one of signals DIV8, DIV16, DIV32, DIV64, DIV128, or DIV256 is in a logic high state, frequency divider circuit 130 causes the frequency of clock signal CKOUT to equal the frequency of clock signal CP0 divided by 8, 16, 32, 64, 128, or 256, respectively. In response to one of signals DIV8, DIV16, DIV32, DIV64, DIV128, or DIV256 being in a logic high state, OR gate circuit 833, 834, 835, 836, 837, or 838 generates a logic high state in its output signal O5, O6, O7, O8, O9, or 010, respectively. When signal O5, O6, O7, O8, O9, or 010 is in a logic high state, XOR gate circuit 824, 825, 826, 827, 828, or 829 generates rising edges in its output signal X5, X6, X7, X8, X9, or X10 in response to falling edges in signal Y5, Y6, Y7, Y8, Y9, or Y10, respectively. When signal O5, O6, O7, O8, O9, or 010 is in a logic high state, XOR gate circuit 824, 825, 826, 827, 828, or 829 generates falling edges in its output signal X5, X6, X7, X8, X9, or X10 in response to rising edges in signal Y5, Y6, Y7, Y8, Y9, or Y10, respectively. Flip-flop circuits 805-811 store the logic states of signals X5-X11 at their Q outputs in signals Y5-Y11, respectively, in response to each rising edge of clock signal CPB.

Signals Y5-Y10 are provided to inputs of AND gate circuits 842-847, respectively. Signals O5-O10 are provided to additional inputs of AND gate circuits 842-847, respectively. Each of AND gate circuits 842-847 performs an AND Boolean logic function on the logic states of its respective input signals to generate its respective output signal. Thus, each of the AND gate circuits 842-847 generates a logic high state in its respective output signal Z4-Z9 in response to both of its input signals being in logic high states. Signals Z4-Z9 are provided to inputs of OR gate circuits 832-837, respectively.

In response to a respective one of signals DIVE, DIV16, DIV32, DIV64, DIV128, or DIV256 being asserted to a logic high state, a respective one of the flip-flop circuits 805-810 generates rising and falling edges in its respective output signal Y5-Y10. Rising and falling edges in signals Y5-Y10 propagate through AND gate circuits 842-847 and OR gate circuits 832-837 to input signals O4-O9 of XOR gate circuits 823-828, respectively. XOR gate circuits 823-828 generate rising and falling edges in their output signals X4-X9 in response to falling and rising edges in signals Y4-Y9, respectively, when their respective input signals O4-O9 are in logic high states. As a result, rising and falling edges (i.e., logic state transitions) propagate down through flip-flop circuits 810, 809, 808, 807, 806, 805, 804, and 803 to AND gate circuit 841 and its output signal Z2. Rising and falling edges in signal Z2 affect the frequency of clock signal CKOUT, as described above.

Inverter 852 inverts the logic state of signal Y11 to generate signal X11. As a result, flip-flop circuit 811 generates rising and falling edges in its output signal Y11 in response to rising and falling edges in its input signal X11. Signal Y11 is provided to an input of OR gate circuit 838. The rising and falling edges in signal Y11 do not propagate to clock signal CKOUT unless signal DIV256 is in a logic high state.

According to an embodiment, an adder circuit includes a first compressor circuit to add values of first, second, third and fourth sets of signals to generate a first sum indicated by fifth and sixth sets of signals. The adder circuit further includes a second compressor circuit to add values of the fifth, the sixth and seventh sets of signals to generate a second sum indicated by eighth and ninth sets of signals. The values of the first and second sets of signals are determined based on the eighth and the ninth sets of signals, respectively. The adder circuit further includes a third compressor circuit to add values of the fifth and the sixth sets of signals to twice a value of the seventh set of signals to generate a third sum indicated by tenth and eleventh sets of signals. The adder circuit further includes a first component adder circuit to add values of the first and the second sets of signals to generate a value of a twelfth set of signals. The adder circuit further includes a second component adder circuit to add the values of the tenth and the eleventh sets of signals to generate a value of a thirteenth set of signals. The adder circuit further includes a multiplexer circuit to provide values of the twelfth and the thirteenth sets of signals in alternating time intervals. This embodiment of an adder circuit is shown, for example, in FIG. 2. This embodiment may be used in conjunction with other embodiments shown and described herein or may be used independently of other embodiments shown and described herein with respect to the other figures.

According to another embodiment, a multiplexer circuit selects among first periodic signals to generate a second periodic signal. The multiplexer circuit includes buffer circuits. Each of the buffer circuits generates the second periodic signal based on a respective one of the first periodic signals when the respective buffer circuit is enabled. Each of the buffer circuits generates a logic state transition in the second periodic signal in response to the next logic state transition in the respective one of the first periodic signals that occurs after the respective buffer circuit is disabled. Each of the buffer circuits prevents logic state transitions in the respective one of the first periodic signals that occur after the next logic state transition from propagating to the second periodic signal while the respective buffer circuit is disabled. Each of the buffer circuits may also include a first latch and a second latch that control when the respective buffer circuit prevents or allows logic state transitions in the respective one of the first periodic signals to propagate to the second periodic signal. This embodiment is shown, for example, in FIGS. 4A-4B. This embodiment may be used in conjunction with other embodiments as shown and described herein or may be used independently of other embodiments shown and described herein with respect to the other figures.

According to yet another embodiment, a phase interpolator circuit includes first buffer circuits, second buffer circuits, and third buffer circuits. The first buffer circuits buffer a first periodic signal to generate a second periodic signal. The phase interpolator circuit adjusts a weight that the first buffer circuits provide to the second periodic signal based on the first periodic signal in response to control signals. The second buffer circuits buffer a third periodic signal to generate the second periodic signal. The phase interpolator circuit adjusts a weight that the second buffer circuits provide to the second periodic signal based on the third periodic signal in response to the control signals. The third buffer circuits buffer a fourth periodic signal to generate the second periodic signal. This embodiment is shown, for example, in FIG. 5A. This embodiment may be used in conjunction with other embodiments as shown and described herein or may be used independently of other embodiments shown and described herein with respect to the other figures.

According to a further embodiment, synchronization generator circuitry includes first frequency divider circuits, a packet serializer circuit, shift register circuits, serial-to-parallel converter circuits, selector circuits, and second frequency divider circuits. Each of the first frequency divider circuits receives a first periodic signal. The first frequency divider circuits generate second periodic signals based on the first periodic signal. Each of the first frequency divider circuits divides a frequency of the first periodic signal by a different frequency division value to generate a frequency of a respective one of the second periodic signals. The packet serializer circuit samples the second periodic signals to generate sampled values. The packet serializer circuit generates a serial signal having serial bits that indicate the sampled values. The shift register circuits provide the serial bits indicated by the serial signal to the serial-to-parallel converter circuits. Each of the serial-to-parallel converter circuits converts the serial bits into a set of parallel bits. Each of the selector circuits generates a synchronization signal based on one set of the parallel bits. The second frequency divider circuits generate third periodic signals. Each of the second frequency divider circuits synchronizes a respective one of the third periodic signals based on a respective one of the synchronization signals. This embodiment is shown, for example, in FIG. 6A. This embodiment may be used in conjunction with other embodiments as shown and described herein or may be used independently of other embodiments shown and described herein with respect to the other figures.

Figure 9:
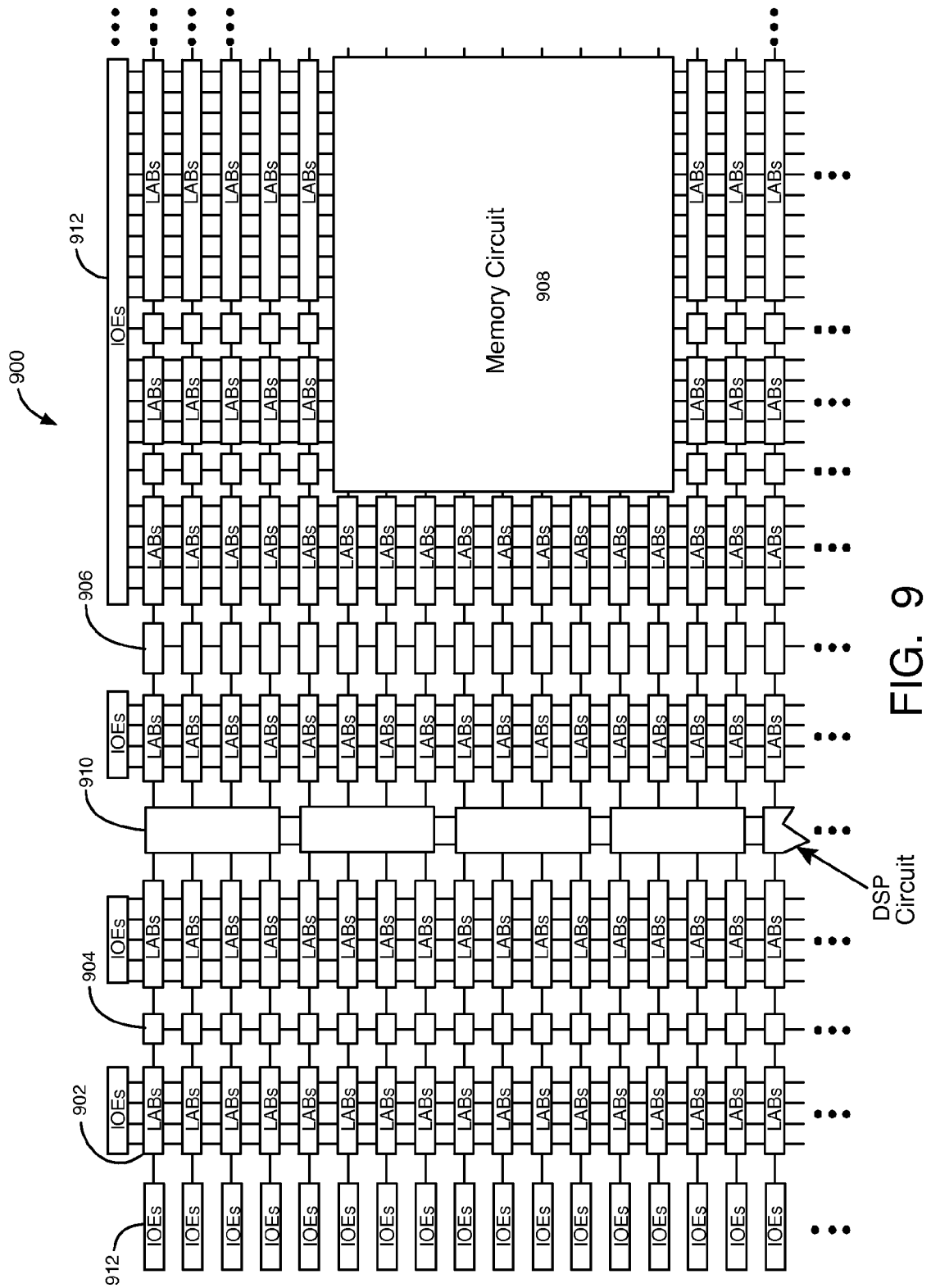
FIG. 9 is a simplified partial block diagram of a field programmable gate array (FPGA) that can include embodiments of the present invention.

FIG. 9 is a simplified partial block diagram of a field programmable gate array (FPGA) 900 that can include embodiments of the present invention. FPGA 900 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 900 includes a two-dimensional array of programmable logic array blocks (or LABs) 902 that are interconnected by a network of column and row interconnect conductors of varying length and speed. LABs 902 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure of conductors. The programmable interconnect structure can be programmed to interconnect the logic elements in almost any desired configuration.

FPGA 900 also includes a distributed memory structure including random access memory (RAM) circuits of varying sizes provided throughout the array. The RAM circuits include, for example, circuits 904, circuits 906, and circuit 908. These memory circuits can also include shift registers and first-in-first-out (FIFO) buffers.

FPGA 900 further includes digital signal processing (DSP) circuits 910 that can implement, for example, multipliers with add or subtract features. Input/output elements (IOEs) 912 support numerous single-ended and differential input/output standards. IOEs 912 include input and output buffers that are coupled to pins of the integrated circuit. The pins are external terminals of the FPGA die that can be used to route, for example, input data signals, output data signals, and supply voltages between the FPGA and one or more external devices. One or more of the IOEs 912 may include one or more FD circuits 100. FPGA 900 is described herein for illustrative purposes. Embodiments of the present invention can be implemented in many different types of integrated circuits.

Figure 10:
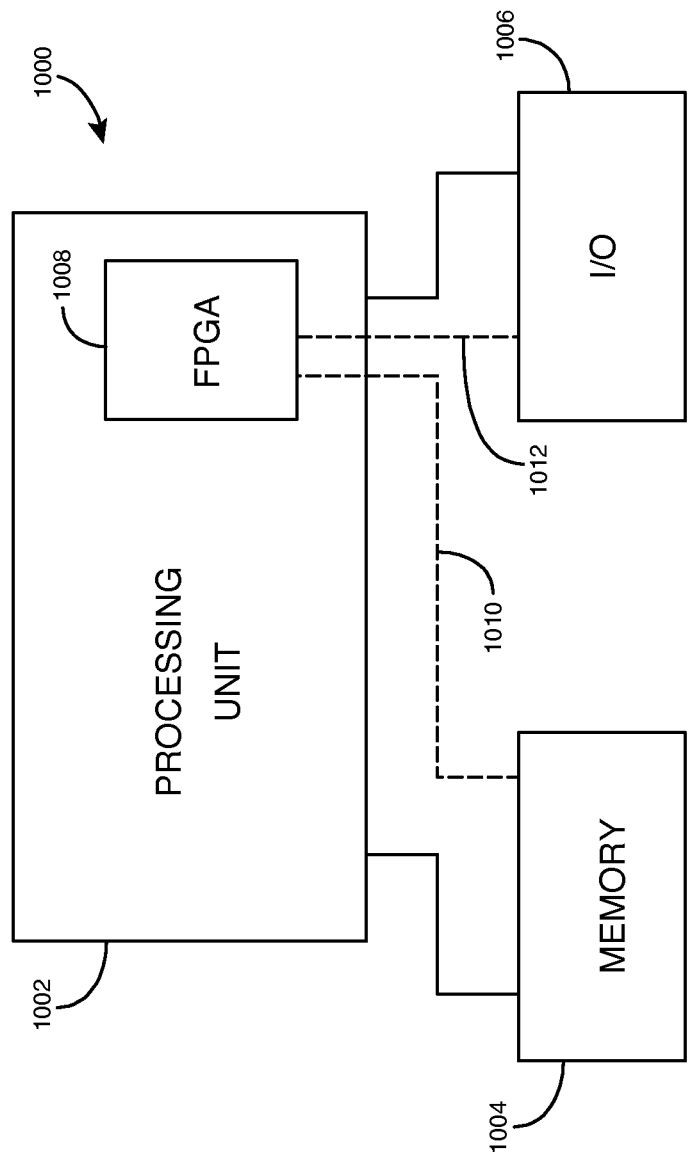
FIG. 10 shows a block diagram of an exemplary digital system that can embody techniques of the present invention.

Embodiments of the present invention can also be implemented in a system that has an FPGA as one of several components. FIG. 10 shows a block diagram of an exemplary digital system 1000 that can embody techniques of the present invention. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004, and an input/output (I/O) unit 1006 interconnected together by one or more buses. According to this exemplary embodiment, an FPGA 1008 is embedded in processing unit 1002. FPGA 1008 can serve many different purposes within the system of FIG. 10. FPGA 1008 can, for example, be a logical building block of processing unit 1002, supporting its internal and external operations. FPGA 1008 is programmed to implement the logical functions necessary to carry on its particular role in system operation. FPGA 1008 can be specially coupled to memory 1004 through connection 1010 and to I/O unit 1006 through connection 1012.

Processing unit 1002 can direct data to an appropriate system component for processing or storage, execute a program stored in memory 1004, receive and transmit data via I/O unit 1006, or other similar functions. Processing unit 1002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 can control the logical operations of the system. As another example, FPGA 1008 acts as a reconfigurable processor that can be reprogrammed as needed to handle a particular computing task. Alternatively, FPGA 1008 can itself include an embedded microprocessor. Memory unit 1004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A frequency divider circuit comprising:
   an adder circuit to generate a summed value;
   first multiplexer circuits to receive first periodic signals and to generate second periodic signals by selecting among the first periodic signals based on the summed value; and
   a first phase interpolator circuit to generate a third periodic signal using a weighted average of the second periodic signals that is determined based on the summed value.

2. The frequency divider circuit of claim 1 further comprising:
   second multiplexer circuits to receive the first periodic signals and to generate fourth periodic signals by selecting among the first periodic signals based on the summed value; and
   a second phase interpolator circuit to generate a fifth periodic signal using a weighted average of the fourth periodic signals that is determined based on the summed value.

3. The frequency divider circuit of claim 1 further comprising:
   a component frequency divider circuit to generate a frequency divided signal using the third periodic signal based on an integer number that is part of a frequency division value, wherein the adder circuit generates the summed value based on a fractional number that is part of the frequency division value, and wherein the frequency divider circuit causes a frequency of the frequency divided signal to equal a frequency of one of the first periodic signals divided by the frequency division value.

4. A frequency divider circuit comprising:
   an adder circuit to generate a summed value;
   first multiplexer circuits to receive first periodic signals and to generate second periodic signals by selecting among the first periodic signals based on the summed value; and
   a phase interpolator circuit to generate a third periodic signal using the second periodic signals based on the summed value,
   wherein the adder circuit generates first summed signals that indicate the summed value, wherein the adder circuit comprises a second multiplexer circuit to generate the first summed signals based on second summed signals in response to a first one of the second periodic signals having a first logic state, and wherein the second multiplexer circuit generates the first summed signals based on third summed signals in response to the first one of the second periodic signals having a second logic state.

5. The frequency divider circuit of claim 4, wherein the adder circuit receives input signals indicating a fractional number that is part of a frequency division value of the frequency divider circuit, wherein the adder circuit adds two times a value of the input signals to a value of the second summed signals in response to each rising edge of the first one of the second periodic signals, and wherein the adder circuit adds two times the value of the input signals to a value of the third summed signals in response to each falling edge of the first one of the second periodic signals.

6. The frequency divider circuit of claim 1, wherein each of the first multiplexer circuits comprises:
   a first buffer circuit to generate a respective one of the second periodic signals based on a first one of the first periodic signals, wherein the first buffer circuit generates a logic state transition in the respective one of the second periodic signals in response to the next logic state transition in the first one of the first periodic signals that occurs after the first buffer circuit is disabled, and wherein the first buffer circuit prevents logic state transitions in the first one of the first periodic signals that occur after the next logic state transition from propagating to the respective one of the second periodic signals while the first buffer circuit is disabled.

7. The frequency divider circuit of claim 6, wherein each of the first multiplexer circuits further comprises:
   a second buffer circuit to generate the respective one of the second periodic signals based on a second one of the first periodic signals, wherein the second buffer circuit generates a logic state transition in the respective one of the second periodic signals in response to the next logic state transition in the second one of the first periodic signals that occurs after the second buffer circuit is disabled, and wherein the second buffer circuit prevents logic state transitions in the second one of the first periodic signals that occur after the next logic state transition from propagating to the respective one of the second periodic signals while the second buffer circuit is disabled.

8. The frequency divider circuit of claim 1, wherein the first phase interpolator circuit comprises:
   first buffer circuits to buffer a first one of the second periodic signals to generate the third periodic signal, wherein the first phase interpolator circuit adjusts a weight that the first buffer circuits provide to the third periodic signal based on the first one of the second periodic signals in response to a change in a subset of signals that indicate the summed value; and
   second buffer circuits to buffer a second one of the second periodic signals to generate the third periodic signal, wherein the first phase interpolator circuit adjusts a weight that the second buffer circuits provide to the third periodic signal based on the second one of the second periodic signals in response to a change in the subset of signals that indicate the summed value.

9. A frequency divider circuit comprising:
   an adder circuit to generate a summed value;
   multiplexer circuits to receive first periodic signals and to generate second periodic signals by selecting among the first periodic signals based on the summed value;
   a phase interpolator circuit to generate a third periodic signal using the second periodic signals based on the summed value; and
   a synchronization detector circuit, wherein the synchronization detector circuit comprises:
   a first component frequency divider circuit to generate a fourth periodic signal based on one of the first periodic signals;
   a second component frequency divider circuit to generate a fifth periodic signal based on one of the second periodic signals;
   a phase detector circuit to generate an indication of a phase difference between the fourth and the fifth periodic signals; and
   a control circuit to generate control signals based on the indication of the phase difference, wherein the adder circuit generates the summed value based on the control signals.

10. The frequency divider circuit of claim 9, wherein the synchronization detector circuit further comprises:
    a comparator circuit to compare a fine phase offset value to the summed value to generate an indication of comparison, wherein the control circuit generates the control signals based on the indication of the comparison to provide fine phase offsets to phases of the second periodic signals, wherein the first component frequency divider circuit receives a coarse phase offset value, and wherein the control circuit generates the control signals based on the indication of the phase difference to provide coarse phase offsets to the phases of the second periodic signals.

11. The frequency divider circuit of claim 1, wherein the adder circuit adjusts the summed value in response to one of the second periodic signals, wherein each of the first multiplexer circuits selects a different one of the first periodic signals to generate a respective one of the second periodic signals in response to a change in first signals indicating a first portion of the summed value, and wherein the first phase interpolator circuit adjusts the weighted average of the second periodic signals used to generate the third periodic signal in response to a change in second signals indicating a second portion of the summed value.

12. A circuit comprising:
    an adder circuit to generate a summed value based on a fractional number that is part of a frequency division value;
    first multiplexer circuits to select among first periodic signals based on the summed value to generate second periodic signals;
    a phase interpolator circuit to generate a third periodic signal using the second periodic signals based on the summed value; and
    a frequency divider circuit to generate a frequency divided signal using the third periodic signal based on an integer number that is part of the frequency division value, wherein the circuit causes a frequency of the frequency divided signal to equal a frequency of one of the first periodic signals divided by the frequency division value.

13. The circuit of claim 12, wherein the adder circuit receives input signals that indicate the fractional number, wherein the adder circuit adds a value of the input signals to a value of summed signals that indicate the summed value in response to each rising edge of a first one of the second periodic signals, and wherein the adder circuit adds the value of the input signals to the value of the summed signals in response to each falling edge of the first one of the second periodic signals.

14. The circuit of claim 12, wherein each of the first multiplexer circuits comprises:
    a buffer circuit to generate a logic state transition in a respective one of the second periodic signals based on the next logic state transition in one of the first periodic signals that occurs after the buffer circuit is disabled, wherein the buffer circuit prevents logic state transitions in the one of the first periodic signals that occur after the next logic state transition from propagating to the respective one of the second periodic signals while the buffer circuit is disabled.

15. The circuit of claim 12, wherein the phase interpolator circuit generates the third periodic signal using a weighted average of the second periodic signals that is determined based on the summed value, and wherein the phase interpolator circuit comprises:

first buffer circuits to buffer a first one of the second periodic signals to generate the third periodic signal, wherein the phase interpolator circuit adjusts a weight that the first buffer circuits provide to the third periodic signal based on the first one of the second periodic signals in response to a change in a subset of signals that indicate the summed value; and second buffer circuits to buffer a second one of the second periodic signals to generate the third periodic signal, wherein the phase interpolator circuit adjusts a weight that the second buffer circuits provide to the third periodic signal based on the second one of the second periodic signals in response to a change in the subset of signals that indicate the summed value.

16. The circuit of claim 12 further comprising a synchronization detector circuit, wherein the synchronization detector circuit comprises:

a control circuit to generate control signals to provide coarse phase offsets to phases of the second periodic signals in response to a synchronization signal, wherein the control circuit generates the control signals to provide fine phase offsets to the phases of the second periodic signals after providing the coarse phase offsets, and wherein the adder circuit generates the summed value based on the fractional number and based on the control signals.

17. A method comprising:

adding a first number to a summed value using an adder circuit;

selecting among first periodic signals using multiplexer circuits to generate second periodic signals based on the summed value;

generating a third periodic signal based on a weighted average of the second periodic signals using a phase interpolator circuit, wherein the phase interpolator circuit determines the weighted average based on the summed value; and generating a frequency divided signal based on the third periodic signal using a frequency divider circuit.

18. A method comprising:

adding a first number to a summed value using an adder circuit, wherein the first number added by the adder circuit to the summed value is based on a fractional number that is part of a frequency division value;

selecting among first periodic signals using multiplexer circuits to generate second periodic signals based on the summed value;

generating a third periodic signal based on the second periodic signals and based on the summed value using a phase interpolator circuit; and dividing a frequency of the third periodic signal by an integer number that is part of the frequency division value to generate a frequency of a frequency divided signal using a frequency divider circuit, wherein the adder circuit, the multiplexer circuits, the phase interpolator circuit, and the frequency divider circuit cause the frequency of the frequency divided signal to equal a frequency of one of the first periodic signals divided by the frequency division value.

19. The method of claim 17, wherein adding a first number to a summed value using an adder circuit comprises adding a value of input signals that is based on the first number to a value of summed signals that indicate the summed value in response to each rising edge of one of the second periodic signals, and adding the value of the input signals to the value of the summed signals in response to each falling edge of the one of the second periodic signals.

20. The method of claim 17, wherein selecting among first periodic signals using multiplexer circuits to generate second periodic signals based on the summed value comprises generating a logic state transition in one of the second periodic signals using a buffer circuit based on the next logic state transition in one of the first periodic signals that occurs after the buffer circuit is disabled, and preventing logic state transitions in the one of the first periodic signals that occur after the next logic state transition from propagating to the one of the second periodic signals while the buffer circuit is disabled.

21. The method of claim 17, wherein generating a third periodic signal based on a weighted average of the second periodic signals comprises:

buffering a first one of the second periodic signals to generate the third periodic signal using first buffer circuits;

adjusting a weight provided by the first buffer circuits to the third periodic signal based on the first one of the second periodic signals in response to changes in a subset of signals that indicate the summed value;

buffering a second one of the second periodic signals to generate the third periodic signal using second buffer circuits; and adjusting a weight provided by the second buffer circuits to the third periodic signal based on the second one of the second periodic signals in response to changes in the subset of signals that indicate the summed value.

* * * * *